US007081417B2

(12) United States Patent
Hinode et al.

(10) Patent No.: US 7,081,417 B2
(45) Date of Patent: Jul. 25, 2006

(54) MANUFACTURING METHOD FOR ELECTRONIC DEVICE AND MULTIPLE LAYER CIRCUITS THEREOF

(75) Inventors: Kenji Hinode, Hachioji (JP); Shuichi Nagasawa, Ryugasaki (JP); Yoshihiro Kitagawa, Tsukuba (JP); Mutsuo Hidaka, Tsukuba (JP); Keiichi Tanabe, Mito (JP)

(73) Assignees: Hitachi, Ltd., Tokyo (JP); NEC Corporation, Tokyo (JP); International Superconductivity Technology Center, the Judicial Foundation, Tokyo (JP)

( * ) Notice: Subject to any disclaimer, the term of this patent is extended or adjusted under 35 U.S.C. 154(b) by 154 days.

(21) Appl. No.: 10/874,537

(22) Filed: Jun. 24, 2004

(65) Prior Publication Data

US 2004/0266209 A1 Dec. 30, 2004

(30) Foreign Application Priority Data

Jun. 27, 2003 (JP) ............................. 2003-183879

(51) Int. Cl.
*H01L 21/302* (2006.01)
(52) U.S. Cl. ...................... 438/723; 438/692; 438/756; 430/313; 216/80; 216/89; 216/97
(58) Field of Classification Search .................. 216/80, 216/90; 430/313; 438/631
See application file for complete search history.

(56) References Cited

U.S. PATENT DOCUMENTS 4,075,756 A * 2/1978 Kircher et al. .................. 216/3

FOREIGN PATENT DOCUMENTS

JP 7-147278 11/1993
JP 2003-324221 5/2002

OTHER PUBLICATIONS

S. Nagasawa et al., "Planarization Technology for Josephson Integrated Circuits", IEEE Electron Device Letters, vol. 9, No. 8 (Aug. 1988), pp. 414-416.
M. B. Ketchen et al., "Sub-μm, Planarized, Nb-AlO$_x$-Nb Josephson Process for 125 mm Wafers Developed in Partnership with Si Technology", Appl. Phys. Lett., vol. 59, No. 20 (Nov. 11, 1991), pp. 2609-2611.
K. Kikuchi et al., "New Fabrication Process of Josephson Tunnel Junctions Using Photosensitive Polyimide Insulation Layer for Superconducting Integrated Circuits", ASC (2002), pp. 1-4.

* cited by examiner

*Primary Examiner*—Nadine G. Norton
*Assistant Examiner*—Maki Angadi
(74) *Attorney, Agent, or Firm*—Reed Smith LLP; Stanley P. Fisher, Esq.; Juan Carlos A. Marquez, Esq.

(57) ABSTRACT

To provide a planarization method which does not depend upon the size and the density of a wiring pattern and in which a reliable wiring system and a Josephson device can be formed and wiring structure, an insulation layer is planarized by forming a reversal pattern mask of wiring and selectively removing the insulation layer on the wiring.

11 Claims, 12 Drawing Sheets

(A)

(B)

(C)

(D)

(E)

(F)

(G)

(A)

(B)

(A)

(B)

(C)

(A)

(B)

MANUFACTURING METHOD FOR ELECTRONIC DEVICE AND MULTIPLE LAYER CIRCUITS THEREOF

CLAIM OF PRIORITY

The present application claims priority from Japanese application JP 2003-183879 filed on Jun. 27, 2003, the content of which is hereby incorporated by reference into this application.

BACKGROUND OF THE INVENTION

The present invention relates to multiple layer circuits of an electronic device and its manufacturing method, particularly relates to an electronic device effective when the electronic device is applied to a Josephson integrated circuit device.

Various devices are made in the arrangement and the wiring of elements included in a highly integrated electronic device. Particularly, for high-density integration, reliable multilevel wiring is important. A process for planarizing an insulation layer provided after a wiring pattern of each layer is formed is applied to a high-density integrated electronic device so as to form multilevel wiring. For this process, chemical mechanical polishing (CMP), spin-on film etchback, bias sputtering, lift-off and others have been used independently or in the combination of these (for example, a non-patent document 1, a non-patent document 2 and a non-patent document 3).

Besides, though the following method is more complex, a method of newly adding processes for photolithography and etching and planarizing in two-stage processes has been proposed (for example, patent documents 1 and 2).

[Non-patent document 1] S. Nagasawa et al, Planarization Technology for Josephson Integrated Circuit, IEEE EDL. Vol. 9, p. 414 (1988).
[Non-patent document 2] M. B. Ketchen et al, Sub-µm, planarized, Nb—$AlO_x$—Nb Josephson process for 125 mm wafers developed in partnership with Si technology, APL(Applied Physics Letters) vol. 59, p. 2609 (1991).
[Non-patent document 3] K. Kikuchi et al, New Fabrication Process of Josephson Tunnel Junctions Using Photosensitive Polyimide Insulation Layer for Superconducting Integrated Circuits, ASC(Applied Superconductivity Conference) 2002, 1EH05
[Patent document 1] JP-A-7-147278
[Patent document 2] JP-A-2003-324221

SUMMARY OF THE INVENTION

In the conventional type method disclosed in the above-mentioned non-patent document, in case a large pattern exists or in case a pattern is extended in a large range and further, in case the density of the pattern greatly varies depending upon a location, planarization is difficult. To reduce the difficulty, in application to an actual process, the following constraints are imposed.

(1) The dimension of a pattern is limited in a certain range.

(2) To keep the density of a pattern in a certain range, a dummy pattern is formed in a region without a pattern.

However, such constraints on a pattern are apt to function as fetters when a high-speed and high-function circuit is designed.

Though according to lift-off disclosed in the above-mentioned non-patent document 1, planarization in a large range is enabled, the lift-off has a problem that a process margin is small and foreign materials (dust particles) are often produced.

Besides, when multiple wiring layers are provided in a state in which planarization is insufficient, the frequency of the occurrence of a short circuit between wiring and wiring and disconnection of wiring in a part different in a level increases, and it is difficult to produce a reliable device at a high yield.

The patent document 1 relates to a method of planarizing a semiconductor element, in this method, minute difference in a level such as that in a connection with lower wiring is reduced or removed by the reflow of BPSG, only difference in a level having large area is left and after the difference in a level having large area is etched, planarization is performed by chemically and mechanically polishing a left protrusion. As the reflow of BPSG is a fluidization process at high temperature, it cannot be applied to a Josephson device including Nb. The reason is that Josephson junction is deteriorated and is broken in a process at high temperature equal to or exceeding approximately 200° C. Bias sputtering may be able to solve minute difference in a level at process temperature equal to or lower than 200° C., however, as the degree of difference in a level increases, sputtering time is extended. To planarize a connection of approximately a few micron (the thickness of a film, that is, the depth of difference in a level is approximately 300 nm), it takes a few times (the ratio of the diameter and the depth of difference in a level is a criterion) of normal sputtering time and the practicability is small. When etching is performed without solving the difference in a level of a connection, the difference in a level is finally left.

Even if it is allowable that difference in a level exists, Nb on the wall of a via hole is exposed to etching and the electric characteristics are deteriorated in the case of a device including Nb when etching is made up to the surface of a lower layer. If etching is made up to a halfway location of the thickness of a BPSG film as proposed in this method, the problem can be avoided, however, the etching up to the halfway location of the thickness of the film deteriorates controllability over the thickness of the film and the uniformity depending upon a location. In the case of a pattern (a peripheral circuit area) the size of which is fixed as in the example disclosed in the patent document 1, an etching condition is adjusted and etching can be optimized, however, in case patterns of multiple size (wiring width and others) generally exist, it is very difficult to find an etching condition without dependency upon the patterns and the dispersion of the thickness depending upon the patterns is caused. Therefore, it is difficult to produce a high-speed device, particularly inductance important in SFQ precisely, repeatedly and uniformly.

Besides, the patent document 2 relates to a Josephson device, this method is based upon a process for so-called damascene, YBCO is deposited thicker than difference in a level (i.e. depth of grooves) and is required to be polished to have final thickness. Though the amount of polishing is reduced to some extent by removing a part of YBCO to be polished in this process, a problem occurs when there are patterns greatly different in the area and the shape of YBCO. If the patterns are in a substantially fixed range (including a case that the size of them is equal to or exceeds certain size), an optimum polishing condition for the patterns can be found, however, when there are patterns greatly different in the area and the shape, it is extremely difficult to find a polishing condition for producing all patterns according to design. A cavity called dishing and erosion is formed and planarization without dependency upon a pattern is difficult. If long-time CMP (the polishing of large thickness) is made under a polishing condition without the selectivity of material, satisfactory flatness is acquired, however, as the end point of polishing cannot be determined, control over the final thickness of YBCO is difficult. As the thickness of the lowest GP layer has only to be in a certain range, sufficient electric characteristics are acquired in such a method. However, when such a method is applied to general multilevel wiring, controllability over the thickness is not satisfactory (unevenness depending upon a location) in this method, and it is difficult to precisely and uniformly produce a high-speed device, particularly inductance important in SFQ.

When the method is applied to a wiring layer where a connection with a lower layer is formed, the connection is exposed to etching, Josephson junction is deteriorated or difference in a level in the connection is left, and flat upper wiring is disabled.

The object of the invention is to provide a method of forming multilevel wiring having a large process margin without depending upon a pattern dimension and pattern density and reliable multilevel wiring formed by the method, particularly wiring suitable for a Josephson device.

After a wiring pattern is formed, an insulation film is formed on this pattern, however, the insulation film is removed using a reversal pattern of the wiring pattern as a mask. As a result, most of the insulation film on the wiring is removed. At that time, only an isolated narrow part having difference in a level is left by substantially equalizing the thickness of the wiring layer and the thickness of the insulation film. After the prior art is applied to this and the part is locally planarized, an insulation film is formed again. If necessary, the information of a contact hole pattern for connecting upper and lower layers and a junction pattern specific to a Josephson device is also added to the reversal pattern of the wiring. In this method, as the thickness of an insulation layer between wiring is determined by only the formed thickness, it can be precisely and uniformly controlled independent of a location. The thickness of the insulation layer is a very important control factor in a very high speed device in which the thickness of its insulation layer has a large effect upon circuit characteristics as inductance, particularly in a Josephson SFQ device provided with multilevel wiring.

Or it is possible to reverse the treatments for a wiring pattern and an insulation film. That is, the insulation film is formed on the wiring pattern, an opening is made in the insulation film, and a wiring pattern connected via the opening is formed. Afterward, most of the wiring pattern except a connection of the wiring pattern is removed using a reversal pattern of the upper wiring pattern as a mask. After a wiring layer is formed, planarizing the left isolated narrow connection having difference in a level, it is patterned.

DESCRIPTION OF THE PREFERRED EMBODIMENTS

Figure 1:
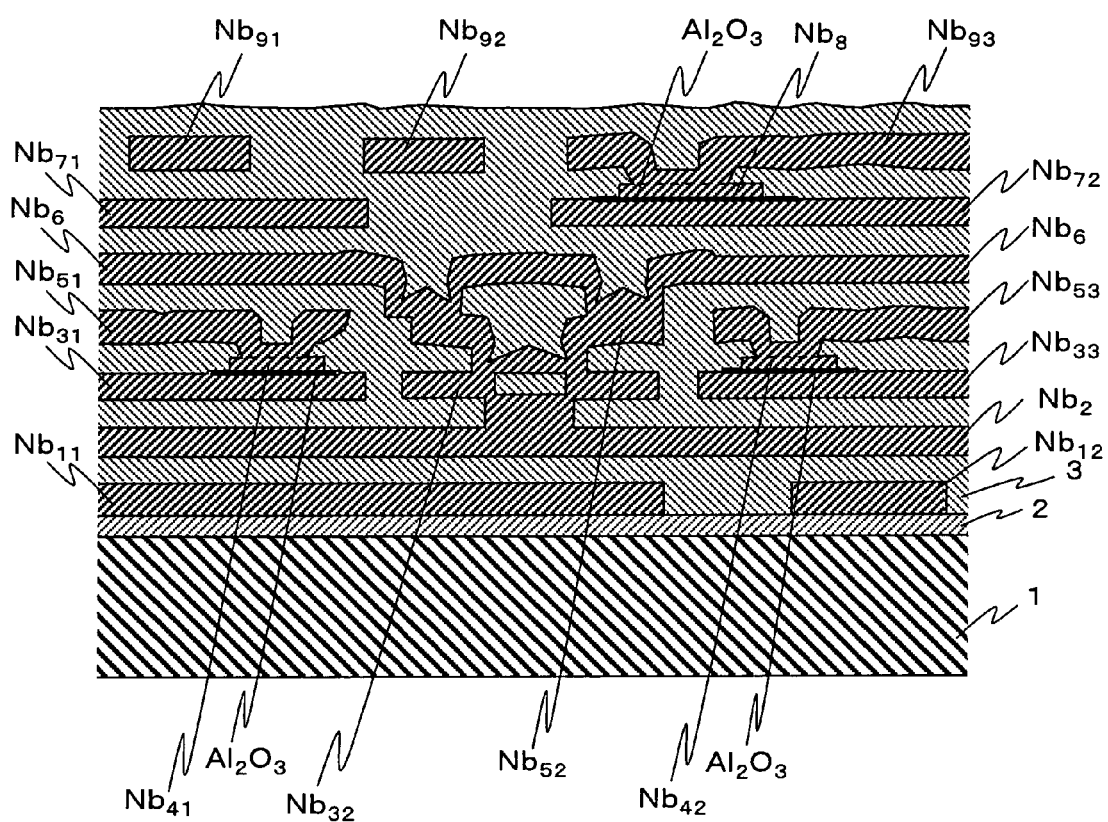
FIG. 1 is a sectional view showing one example of superconducting multilevel wiring effective when the invention is applied.
Figure 2:
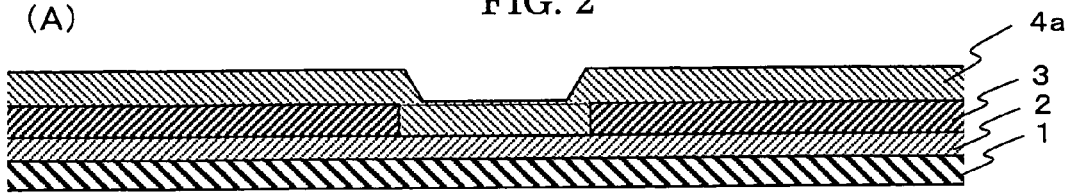
FIGS. 2A to 2G are sectional views of a device for explaining connection between two wiring patterns and a process for forming Josephson junction on one of the wiring patterns.
Figure 2:
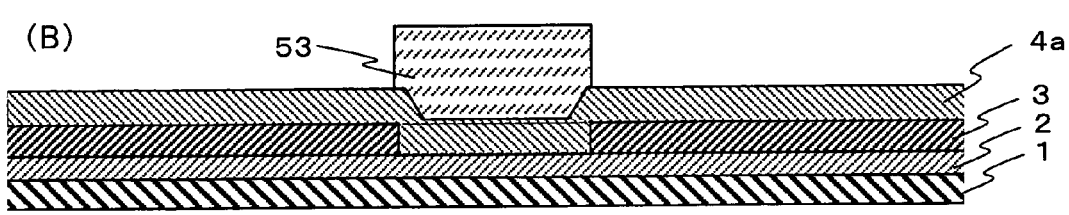
Figure 2:
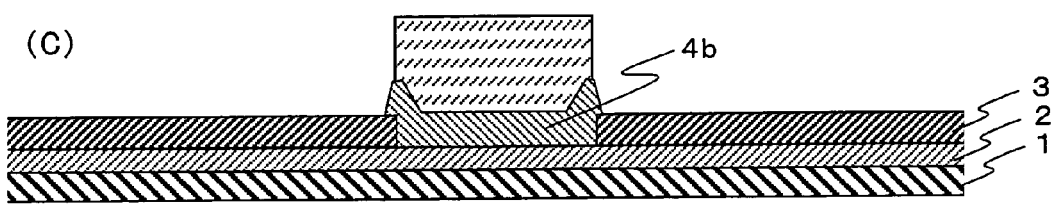
Figure 2:
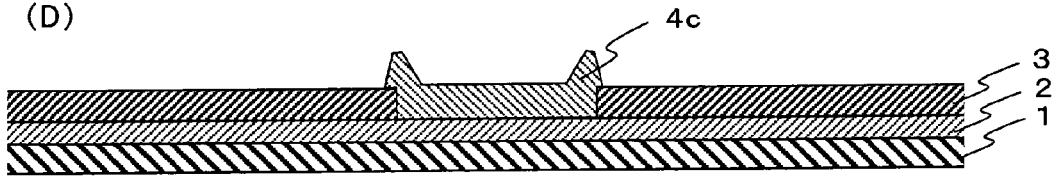
Figure 2:
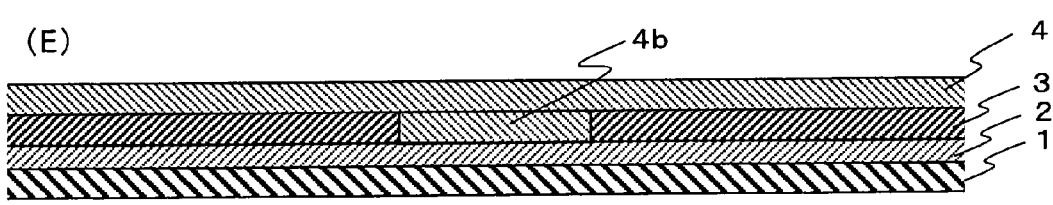
Figure 2:
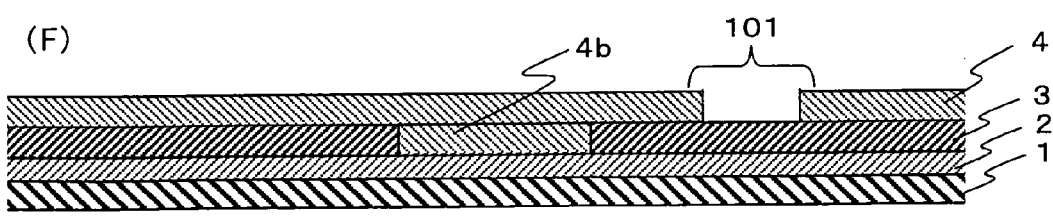
Figure 2:
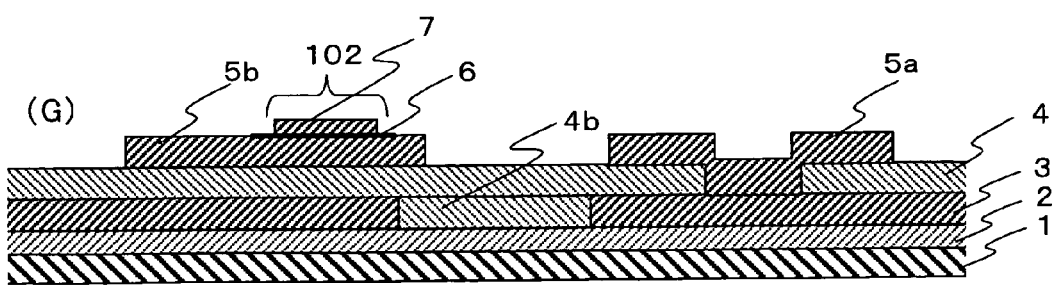

FIG. 1 is a sectional view showing one example of superconducting multilevel wiring effective in applying the invention. A reference number 1 denotes a silicon substrate, 2 denotes an insulation film made of thermally oxidized silicon, 3 denotes an insulation film made of $SiO_2$ by sputtering of each layer, Nb denotes a niobium layer for superconducting wiring, and $Al_2O_3$ denotes an aluminum oxide layer. In FIG. 1, as for the $SiO_2$ layer 3 for the insulation film, though the reference number is allocated to only the lowest layer to avoid intricacy, the other layers are expressed as the insulation film made of $SiO_2$ by the same hatching toward the right downside. Similarly, in the following drawings, a silicon substrate is expressed by thick hatching toward the right downside, an insulation film made of thermally oxidized silicon is expressed by thin hatching toward the left downside, an insulation film made of $SiO_2$ is expressed by thin hatching toward the right downside, a niobium layer is expressed by thick hatching toward the left downside, and an aluminum oxide layer is expressed by a thick painted-out line.

The multilevel wiring shown in FIG. 1 is formed according to the following procedure for example. Wiring patterns $Nb_{11}$, $Nb_{12}$ made of niobium are formed on the thermal silicon oxide film 2 formed on the silicon substrate 1. After the insulation film 3 made of $SiO_2$ is formed on them, the insulation film is planarized. Next, a wiring pattern $Nb_2$ made of niobium is formed, after the insulation film 3 made of $SiO_2$ is formed on it, the insulation film is planarized, and an opening for connecting the wiring pattern $Nb_2$ made of niobium and a wiring pattern $Nb_{32}$ made of niobium is formed in the corresponding position of the insulation film 3 made of $SiO_2$. Wiring patterns $Nb_{31}$, $Nb_{32}$, $Nb_{33}$ respectively made of niobium are formed. At this stage, the wiring pattern $Nb_2$ made of niobium and the wiring pattern $Nb_{32}$ made of niobium are connected.

Next, to form Josephson junction in a part of the wiring pattern $Nb_{31}$ made of niobium and a part of the wiring pattern $Nb_{33}$ made of niobium, a layer made of aluminum oxide $Al_2O_3$ is formed in the corresponding position, and a niobium layer $Nb_{41}$/$Nb_{42}$ is formed on each layer. The insulation film 3 made of $SiO_2$ is formed on/above it and is planarized. To connect each wiring pattern $Nb_{31}$, $Nb_{33}$ which is made of niobium and on which Josephson junction is formed and each wiring pattern $Nb_{51}$, $Nb_{53}$ made of niobium and to connect the niobium layer $Nb_{32}$ to a niobium layer $Nb_6$, an opening is formed in the corresponding position of the insulation film 3 made of $SiO_2$. The wiring patterns $Nb_{51}$, $Nb_{52}$, $Nb_{53}$ made of niobium are formed. At this stage, each wiring pattern $Nb_{31}$, $Nb_{33}$ which is made of niobium and on which Josephson junction is formed and each wiring pattern $Nb_{51}$, $Nb_{53}$ made of niobium are connected. Besides, the niobium layer $Nb_{32}$ and the niobium layer $Nb_{52}$ are connected.

Next, after the insulation layer 3 made of $SiO_2$ is formed on them, the insulation layer is planarized. To connect the niobium layer $Nb_{32}$ to the niobium layer $Nb_6$ via the niobium layer $Nb_{52}$, an opening is formed in the insulation film 3 made of $SiO_2$ in the corresponding position of the niobium layer $Nb_{52}$. A wiring pattern $Nb_6$ made of niobium is formed. At this stage, the wiring pattern $Nb_{52}$ made of niobium and the wiring pattern $Nb_6$ made of niobium are connected and as a result, the niobium layer $Nb_{32}$ and the niobium layer $Nb_6$ are connected. After the insulation film 3 made of $SiO_2$ is formed on it, the insulation film is planarized, and a wiring pattern $Nb_{71}$ made of niobium and a wiring pattern $Nb_{72}$ made of niobium are formed on it.

Next, to form Josephson junction on a part of the wiring pattern $Nb_{72}$ made of niobium, a layer made of aluminum oxide $Al_2O_3$ is formed in the corresponding position and a niobium layer $Nb_8$ is formed on it. After the insulation film 3 made of $SiO_2$ is formed on it, the insulation film is planarized. To connect the wiring pattern $Nb_{72}$ made of niobium on which Josephson junction is formed and a wiring pattern $Nb_{93}$ made of niobium, an opening is formed in the corresponding position of the insulation film 3 made of $SiO_2$. Wiring patterns $Nb_{91}$, $Nb_{92}$, $Nb_{93}$ made of niobium are formed. At this stage, the wiring pattern $Nb_{72}$ which is made of niobium and on which Josephson junction is formed and the wiring pattern $Nb_{93}$ made of niobium are connected.

Next, the insulation film 3 made of $SiO_2$ for protecting the wiring patterns $Nb_{91}$, $Nb_{92}$, $Nb_{93}$ made of niobium is formed.

The characteristics of the multilevel wiring are as follows.

(1) Independent of whether the wiring made of niobium exists or not, each niobium layer over it is flatly formed on the substantially same plane.

(2) The upper wiring on a via hole via which the wiring made of Nb is connected to lower wiring is also flatly formed on the substantially same plane without making difference in a level on the via hole.

(3) In a location where via holes are stacked, the insulation film is buried in each via hole and this enhances the flatness of the upper layer.

(4) It is normally difficult to form Josephson junction on the lower step, however, this method has no constraint, and in a location with the lower step, Josephson junction can be also formed. Therefore, a device provided with two or more types of Josephson junctions on plural layers can be formed.

As described above, to realize multilevel wiring, a procedure for forming a wiring pattern, depositing an insulation layer, further planarizing the insulation layer and next, forming a wiring pattern is repeated. Therefore, a finished state of the planarization of the insulation layer is an important factor of the reliability of a produced device.

In case large-scale semiconductor equipment is used, the planarization of an insulation layer has realized without deteriorating the throughput of the whole process by using high-performance CMP equipment. However, in case such high-performance CMP equipment cannot be used such as in case the production scale is small, the sufficient planarization of an insulation layer is often difficult. In the invention, in such a case, required planarization can be also realized and reliable multilevel wiring is realized. It will be concretely described below.

Embodiment I

FIGS. 2 to 5 show that the invention is applied to planarized multilevel wiring of a niobium Josephson device and show a process for forming an insulation film, wiring and a connection between layers. The process will be described in the order of the drawings.

FIGS. 2A to 2G are sectional views of a device for explaining two wiring patterns, connection between them and a process for forming Josephson junction on one of the wiring patterns. As shown in FIG. 2A, a thermal silicon-oxide film 2 is formed on a silicon substrate 1 as an insulation film. For a first metallic layer, a niobium layer 3 (300 nm thick) is formed by sputtering and is patterned in a desired shape by normal photolithography and dry etching.

A silicon-oxide film 4a (SiO$_2$; 300 nm thick) is formed on it as an insulation film by sputtering.

The thickness of the insulation film 4a made of SiO$_2$ formed in a region without the niobium wiring layer 3 on the downside is adjusted so that the surface is at the substantially same level as the surface of the niobium wiring layer 3. In this case, it is desirable that the insulation film 4a which is made of SiO$_2$ and the thickness of which is 350 nm is thicker than the niobium layer 3 having the thickness of 300 nm by 50 nm. The reason is to compensate an etched part equivalent to approximately 50 nm of the insulation film 2 made of SiO$_2$ under the niobium layer when the niobium layer 3 is patterned.

In case a step formed by the niobium layer 3 is small, normal sputtering can be used, however, to bury between wiring 3 made of niobium without voids and produce a wiring system the insulation performance of which is reliable, bias sputtering excellent in step coverage is suitable.

FIG. 2B shows a result of forming a mask for removing a convex portion of the insulation film 4a made of SiO$_2$ formed in FIG. 2A by a resist film. This is a result of providing the resist film overall in a state shown in FIG. 2A and forming by photolithography so that the result is a substantially reversal pattern of the wiring pattern 3 made of niobium. To be exact, the reversal pattern broadened by 0.3 µm is used. Broadening by 0.3 µm means moving a boundary outside by 0.3 µm so that a region of the resist for functioning as a mask increases in both directions of X and Y. Operation for broadening is required for securely stopping the etching of the insulation film 4a made of SiO$_2$ on the surface of the niobium layer 3 in a step (an etching process) to be explained in FIG. 2C. That is, as a photoresist mask 53 is not formed by self-aligning with the lower pattern, slight misalignment with the lower pattern may be made. Even if misalignment exists, the etching of the insulation film 4a made of SiO$_2$ can be stopped on the surface of the niobium layer 3 by broadening the reversal pattern by 0.3 µm. The amount of broading is determined dependently on the expectec misalignment. Needless to say, the smaller a broadened amount is, the easier planarization after it is.

FIG. 2C shows a state in which the insulation film 4a made of SiO$_2$ is etched with the photoresist mask 53 and as a required part, only a region 4b is left. For etching gas, CHF$_3$ is used. Hereby, the etching rate of the niobium layer 3 can be reduced up to ⅒ to 1/20 of the etching rate of the insulation film 4a made of SiO$_2$. As a result, sufficient overetching time can be secured and the etching thickness of the insulation film 4a made of SiO$_2$ can be stopped on the surface of the niobium layer 3 even if the etching thickness is slightly different depending upon a location. As clear from FIG. 2C, the undesirable etching of the insulation film 4a made of SiO$_2$ by the misalignment of the pattern can be prevented by broadening the reversal pattern even if overetching time is long.

FIG. 2D shows a state in which the photoresist mask 53 is removed after the process in FIG. 2C. A part having difference in a level left at this stage of the region 4b of the insulation film made of SiO$_2$ is only the periphery 4c of the wiring pattern 3 made of niobium. The width of these patterns is approximately 0.5 µm or less. That is, according to the invention, a convex portion of the surface of the wide insulation film 4a made of SiO$_2$ originally existing in a part of the niobium wiring pattern 3 can be changed to the narrow convex portion 4c of the surface existing only in the periphery of the wiring as shown in FIG. 2D. In addition, the density of the narrow convex portion 4c of the surface is low and in a normal pattern, the ratio of the convex portion can be reduced up to approximately 10% or less.

FIG. 2E shows a state in which an insulation film 4 made of SiO$_2$ is formed on the wiring pattern 3 made of niobium and the pattern 4b made of SiO$_2$ between the wiring patterns in addition to the structure shown in FIG. 2D, applying bias to the silicon substrate 1. The convex portion left in FIG. 2D can be substantially removed by suitably setting a bias condition and can be planarized. In this case, bias is set to a value at which 70 to 90% of a deposited amount of SiO$_2$ is etched and the insulation film 4 made of SiO$_2$ having the thickness of 300 nm is formed.

Next, as shown in FIG. 2F, the insulation film 4 made of SiO$_2$ in a desired position is removed using photolithography and dry etching and a via hole 101 is made. Next, as shown in FIG. 2G, an inclusion at the bottom of the via hole is removed by sputter cleaning, niobium layers 5a and 5b (300 nm thick) are formed in a state in which a vacuum is kept, and continuously, an aluminum-oxide layer 6 is formed by sputtering. As for the layer 6, the aluminum-oxide layer a few nm thick is formed by holding aluminum sputtered by 10 nm in a chamber the oxygen partial pressure of which is controlled for fixed time. Next, a niobium layer 7 (150 nm thick) is formed by sputtering. A three-layer structure film composed of the niobium layer 5, the aluminum-oxide layer 6 and the niobium layer 7 is patterned in the order, and a wiring pattern 5b made of niobium and provided with a junction 102 to be Josephson junction and a wiring pattern 5a made of niobium and connected to the lower niobium layer 3 are formed.

FIGS. 3A, 3B, 3C and 3D are sectional views of the device for explaining a pre-step of a process for forming an insulation film 8 made of SiO$_2$ having even thickness on the wiring pattern 5b made of niobium and provided with the junction 102 and the wiring pattern 5a made of niobium and connected to the lower niobium layer 3.

FIG. 3A shows a state in which the insulation film 8 made of SiO$_2$ and having the thickness of 350 nm is formed by bias sputtering. The thickness of the insulation film is adjusted so that the surface of the insulation film 8 made of SiO$_2$ and formed in a region without the niobium layers 5a, 5b and 7 on the downside is at the substantially same level as each surface of the niobium layers 5a and 5b. In this case, it is desirable that the insulation film 8 made of SiO$_2$ and having the thickness of 350 nm thicker than each niobium layer 5a, 5b having the thickness of 300 nm by 50 nm is formed. This reason is to compensate an etched part by approximately 50 nm of the lower insulation film 4 made of SiO$_2$ when the niobium layer 5 is patterned.

In case the difference in a level of the niobium layers 5a and 5b is small, normal sputtering can be also used, however, to bury between the wiring niobium layers 5a and 5b without voids and produce a wiring system excellent in insulation reliability, bias sputtering excellent in step coverage is suitable. As in the first embodiment, the heat resistance of the junction 102 is 150 to 200° C. and is low, the formation of an insulation film in chemical vapour deposition (CVD) is not performed, however, in case no problem occurs as described above, the formation of an insulation film 8 made of SiO$_2$ in CVD excellent in step coverage is also enabled.

FIG. 3B shows a result of forming a mask for removing convex portions of the insulation film 8 made of SiO$_2$ and formed in FIG. 3A by a resist film. This is a result of providing a resist film 50 overall in a state shown in FIG. 3A and forming by photolithography by photomasks based upon reversal patterns of the wiring patterns 5a, 5b made of niobium. In this case, the reversal patterns of the wiring patterns 5a, 5b made of niobium do not mean simple reversal patterns. That is, a resist film 50a corresponds to reversal patterns of the wiring patterns 5a, 5b made of niobium. A resist film 50b corresponds to difference in a level made in a connection of the lower niobium layer 3 and the niobium layer 5a via the via hole 101, and a resist film 50c corresponds to difference in a level made in the junction 102. For these parts, the pattern information of the junction 102 and the via hole 101 is synthesized with the pattern information of the wiring patterns 5a, 5b made of niobium and a mask pattern is produced so that the resist film 50 is left.

Actually, further, the reversal pattern broadened by 0.3 μm is used. As described above, operation for broadening is a device for securely stopping the etching of the insulation film 8 made of $SiO_2$ on each surface of the niobium layers 5a, 5b and 7 in a step (an etching process) shown in FIG. 3C. That is, as the photoresist masks 50a, 50b and 50c are not formed by self-aligning with the lower pattern, slight misalignment with the lower pattern may be made. The etching of the insulation film 8 made of $SiO_2$ can be stopped on each surface of the niobium layers 5a, 5b and 7 by broadening the reversal pattern by 0.3 μm even if misalignment exists. The amount of broading is determined dependently on the expectec misalignment. Needless to say, the smaller a broadened amount is, the easier planarization after it is.

FIG. 3C shows a state in which the insulation film 8 made of $SiO_2$ is etched using the photoresist masks 50a, 50b and 50c. $CHF_3$ is used for etching gas. Hereby, the etching rate of the niobium layers 5a, 5b and 7 can be reduced up to $1/10$ to $1/20$ of the etching rate of the insulation film 8 made of $SiO_2$. As a result, sufficient overetching time can be secured and the etching can be stopped on each surface of the niobium layers 5a, 5b and 7 even if the etching thickness of the insulation film 8 made of $SiO_2$ is slightly different depending upon a location. As clear from FIG. 3C, the undesirable etching of the insulation film 8 made of $SiO_2$ by the misalignment of the pattern can be prevented by broadening the reversal pattern even if overetching time is long.

FIG. 3D shows a state in which the photoresist masks 50a, 50b and 50c are removed after the processing shown in FIG. 3C. The steps left at this stage of the insulation film 8 made of $SiO_2$ are only the periphery 8a of the wiring patterns 5a, 5b made of niobium, the periphery 8b of the via hole and the periphery 8c of the junction. The width of these patterns is approximately 0.5 μm or less. That is, according to the invention, the convex portion of the surface of the wide insulation film 8 made of $SiO_2$ existing in each part of the wiring patterns 5a, 5b made of niobium can be changed to narrow convex portions 8a, 8b, 8c in the periphery of the wide insulation film as shown in FIG. 3D. In addition, the density of the narrow convex portions 8a, 8b, 8c in the periphery is low and in a normal pattern, the ratio of the convex portion can be reduced up to approximately 10% or less.

FIGS. 4A and 4B show subsequent treatment succeeding a stage at which the process shown in FIG. 3D is finished and are sectional views of the device for explaining a state in which the insulation film 8 made of $SiO_2$ and having even thickness is formed on the wiring pattern 5b made of niobium and the wiring pattern 5a made of niobium and connected to the lower niobium layer 3.

FIG. 4A shows that the insulation film 8 made of $SiO_2$ is formed on the wiring pattern 5b made of niobium and the wiring pattern 5a made of niobium and connected to the lower niobium layer 3, applying bias to the silicon substrate 1 in addition to the structure shown in FIG. 3D. The convex portions left in FIG. 3D are substantially removed by suitably setting a bias condition and can be planarized. In this case, bias is set to a value in which 70 to 90% of a deposited amount of $SiO_2$ is etched and the insulation film 8 made of $SiO_2$ and having the thickness of 300 nm is formed.

Difference in a level left on the surface of the insulation film 8 made of $SiO_2$ in this state is at most 50 nm and can be reduced up to approximately $1/10$ of the difference in a level shown in FIG. 3D. Therefore, a wiring pattern is formed on the insulation film 8 made of $SiO_2$ or an opening is made in the insulation film 8 made of $SiO_2$, and connection with the wiring pattern formed on the insulation film 8 made of $SiO_2$ is enabled. Reliable and planarized multilevel wiring can be formed by repeating this process.

When each surface of the lower wiring patterns 5a, 5b made of niobium is cleaned by argon sputtering cleaning before the deposition of the insulation film 8 made of $SiO_2$, a problem of the separation (peeling off) of the insulation film made of $SiO_2$ caused by the deterioration of the adhesive strength of the niobium layer and the insulation film made of $SiO_2$ can be prevented.

FIG. 4B shows a result of further polishing the surface of the insulation film 8 made of $SiO_2$ by approximately 50 nm in CMP in addition to the structure shown in FIG. 4A. In FIG. 4B, the flatness of the surface of the insulation film 8 made of $SiO_2$ shown in FIG. 4A is enhanced and the difference in a level of the insulation film 8 made of $SiO_2$ left at this stage is approximately 20 nm equivalent to a half of that shown in FIG. 4A or less. If a process by CMP is added, structure more suitable for multilevel wiring is acquired.

Planarization directly by CMP from a state shown in FIG. 3D is also possible without using bias sputtering. Particularly, in a region without a junction or a via hole, that is, in a region 8a provided with only difference in a level 8a, planarization is enabled by only CMP for a short time. As the ratio of the convex portions is very small as described above, polishing in polishing time of approximately one minute on a simple condition without depending upon a high-performance CMP machine adopted in a large-scale integrated semiconductor manufacturing system is sufficient. In this case, the insulation film 8 made of $SiO_2$ is required to be formed by sputtering after planarization for the next wiring pattern.

Planarization by a method except the above-mentioned method is also possible. When resist is applied to the whole insulation film 8 made of $SiO_2$ in the state shown in FIG. 3D and etchback is performed using mixed gas of $CHF_3$ and $O_2$, the substantially similar flatness to that shown in FIG. 4A can be enhanced.

In the invention, as described above, the convex portions of the surface of the whole wiring pattern have difference in a level and prevents planarization in the prior art, while only the periphery of the wiring pattern is processed. Therefore, difference in a level can be efficiently removed in the simple method.

FIGS. 5A and 5B show subsequent treatment succeeding a stage at which the process shown in FIG. 4B is finished and are sectional views of the device for explaining a state in which via holes 103, 104 are made in the insulation film 8 made of $SiO_2$ on the niobium layer 7 joined to the wiring pattern 5b made of niobium and the wiring pattern 5a made of niobium and connected to the lower niobium layer 3 and the niobium layer 7 and the wiring pattern 5a are connected to wiring patterns 9a, 9b made of niobium and formed on the insulation film 8 made of $SiO_2$.

FIG. 5A shows a state in which the via holes 103, 104 are made in the insulation film 8 made of SiO$_2$ using normal photolithography and dry etching at a state at which the process shown in FIG. 4B is finished. It is desirable that etching for making the via holes 103, 104 is slightly overetching to more securely connect the niobium layer 7 and the wiring pattern 5a made of niobium to the upper wiring. However, as the wiring pattern 5a made of niobium is concave because of the via hole 101 (see FIG. 2B), it is desirable that the part 8a existing in the part of the insulation film 8 made of SiO$_2$ is not excessively etched. The via hole 104 is slightly wider (for example, approximately 1 µm) than the lower via hole 101 for the wiring pattern 3 made of niobium and the wiring pattern 5a made of niobium. This is to more securely connect the wiring pattern 5a made of niobium and the upper wiring because the part 8a of the insulation film 8 made of SiO$_2$ is formed in an upper part of the via hole 101 of the wiring pattern 5a made of niobium by the via hole 101.

FIG. 5B shows a state in which the niobium layers 9a, 9b respectively having the thickness of 300 nm are formed after the process shown in FIG. 5A and are patterned in a predetermined wiring shape. In the via hole 104, difference in a level in a part corresponding to the via hole of the wiring pattern 9b made of niobium does not extremely increase because the part 8a of the insulation film 8 made of SiO$_2$ is left in the via hole of the wiring pattern 5a made of niobium.

As shown in FIG. 5B, after a required wiring process is finished, the upper wiring patterns made of niobium can be formed by forming an insulation film made of SiO$_2$, removing difference in a level and forming an insulation film made of SiO$_2$ again according to the procedure shown in FIGS. 3A to 3D and FIGS. 4A and 4B. As described above, as no extreme difference in a level is made in forming the insulation film made of SiO$_2$ by leaving the part of the insulation film made of SiO$_2$ even if openings for via holes are stacked, further multiple via holes can be vertically stacked, a degree of freedom in the arrangement of the device and the wiring patterns increases, and integration is enhanced.

Figure 3:
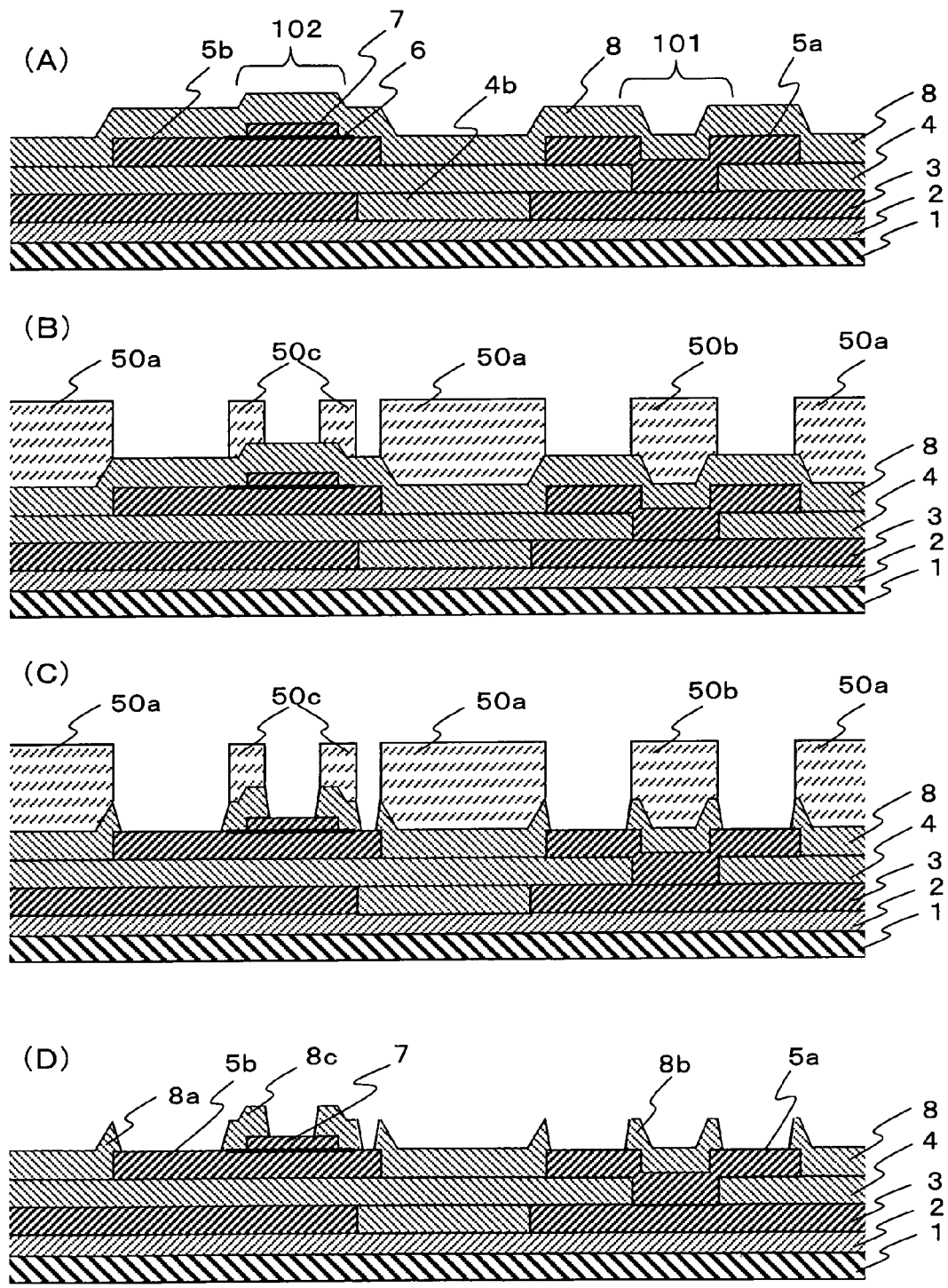
FIGS. 3A, 3B, 3C and 3D are sectional views of the device for explaining a pre-step of a process for forming an insulation film having even thickness on a wiring pattern made of niobium and provided with a junction and a wiring pattern made of niobium and connected to the lower niobium layer.
Figure 4:
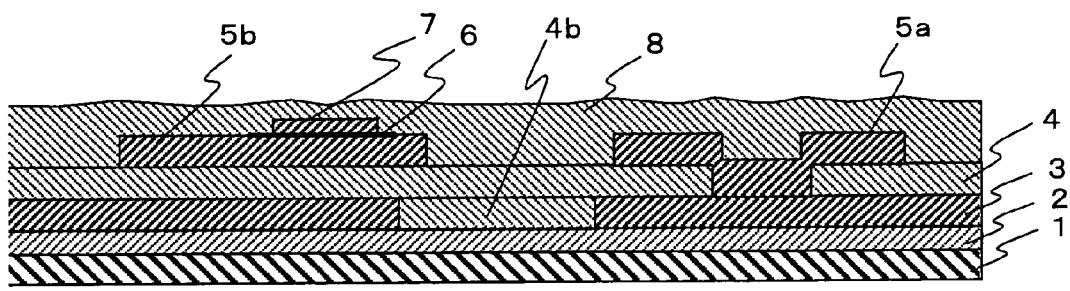
FIGS. 4A and 4B show subsequent treatment succeeding a stage at which the process shown in FIG. 3D is finished and are sectional views of the device for explaining a state in which an insulation film having even thickness is formed on the wiring pattern made of niobium and the wiring pattern made of niobium and connected to the lower niobium layer.
Figure 4:
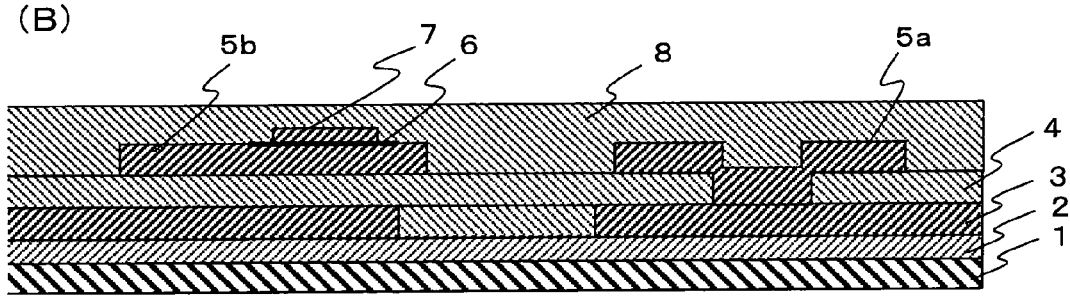
Figure 5:
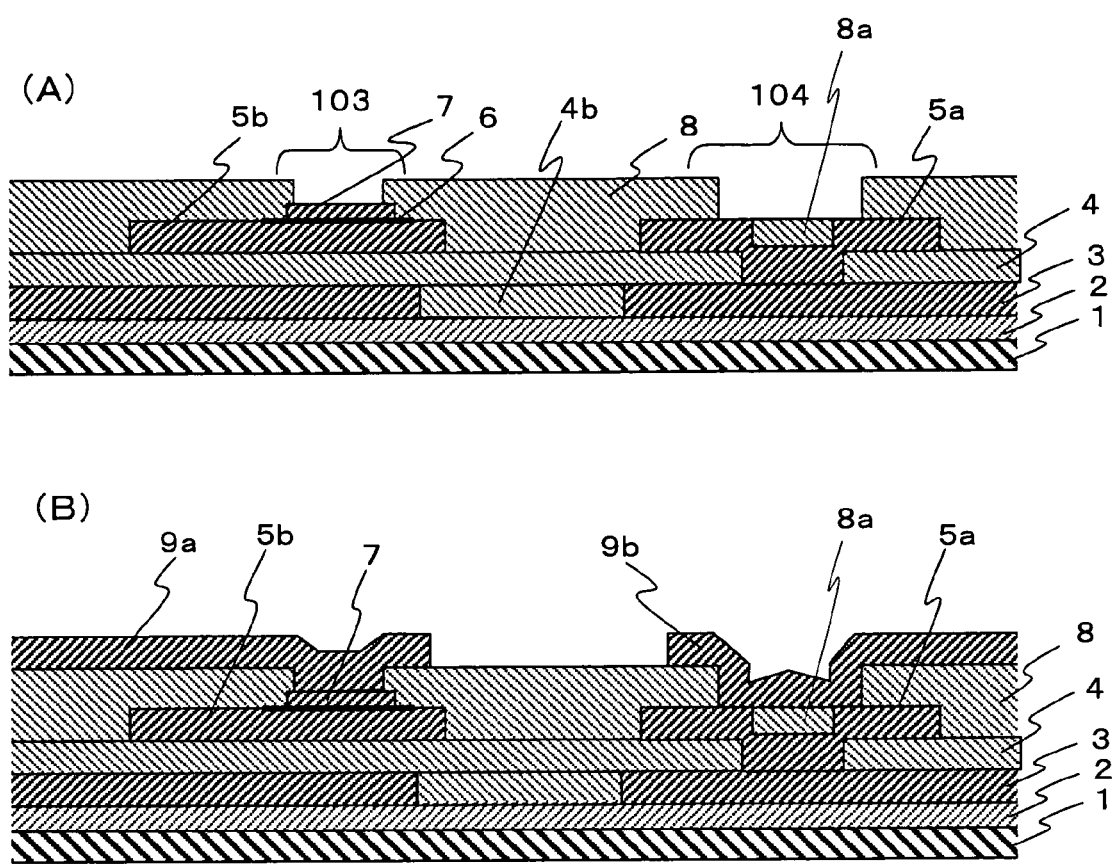
FIGS. 5A and 5B show subsequent treatment succeeding a stage at which the process shown in FIG. 4B is finished and are sectional views of the device for explaining a state in which a via hole is made in the insulation film made of $SiO_2$ on the niobium layer of the junction of the wiring pattern made of niobium and on the wiring pattern made of niobium and connected to the lower niobium layer and each existing niobium layer is connected to a wiring pattern made of niobium formed on the insulation film made of $SiO_2$ via each via hole.

Multilevel wiring is provided by repeating the processes shown in FIGS. 3, 4 and 5, the device composed of 5-layer wiring is formed and the characteristics are evaluated. Table 1 shows the ratio of non-defective ones of 60 chips one wafer.

TABLE 1

| Planarization method | TEG1 | TEG2 | TEG3 |
|---|---|---|---|
| Only bias sputtering | 57/60 | 55/60 | 59/60 |
| Bias sputtering and CMP | 59/60 | 60/60 | 60/60 |
| Applying bias sputtering to only junction layer/Applying CMP to other part | 60/60 | 60/60 | 60/60 |
| Same, however, simple reversal pattern of only 50a not including 50b, 50c | 60/60 | 38/60 | 55/60 |
| Conventional type method | 0/60 | 5/60 | 50/60 |

In Table 1, for a planarization method, (1) "only bias sputtering" means a case that multilevel wiring is produced in a step shown in FIG. 5A and succeeding steps after planarization is made in a state shown in FIG. 4A.

(2) "Bias sputtering and CMP" means a case that multilevel wiring is produced in FIG. 5A and succeeding steps after planarization is made in a state shown in FIG. 4B.

(3) "Applying bias sputtering to only a junction layer/ Applying CMP to other parts" means a case that multilevel wiring is produced in the step shown in FIG. 5A and the succeeding steps after bias sputtering is applied to the convex portion 8c of the insulation film made of SiO$_2$ around the junction in the state shown in FIG. 3D and planarization by CMP is made.

(4) "Same, however, a simple reversal pattern of only 50a not including 50b, 50c" means a case that multilevel wiring is produced in the step shown in FIG. 5A and the succeeding steps after bias sputtering is applied and planarization by CMP is made in a state in which there are no resist film 50b corresponding to difference in a level made in a connection shown in FIG. 3B of the niobium layer 3 and the niobium layer 5a and no resist film 50c corresponding to difference in a level made in the junction 102.

Besides, the conventional type method means a case that the device is formed without the removal by etching with a reversal pattern of the insulation film made of SiO$_2$ and the treatment of steps in a level left at the stage of the etching respectively described in relation to FIGS. 3C and 3D.

TEG1: Interlayer leak on steps of lower wiring (a cross meander pattern, L/S=2/2 µm, opposite area: 40000 µm$^2$). Non-defective criterion: 100 MΩ or more when 1 V is applied TEG2: 1000 pieces of via hole chains. Via holes are stacked and the diameter of via holes is 0.5 µm, 1.5 µm and 2.5 µm from the downside. Non-defective criterion: critical current at liquid helium temperature (4.2 k): 10 mA or more TEG3: 1000 pieces of Josephson junction chains. The diameter of a junction is 1.0 µm. Non-defective criterion: critical current dispersion (standard deviation): 2% or less In the first embodiment, a yield is higher than that in the conventional type method and planarized multilevel wiring can be formed. A pattern (TEG1 and others) in arrangement that cannot be formed in the conventional type method can be realized. In the planarization method depending upon only the simple reversal pattern described in above (4), for TEG2, a yield is not satisfactory so much, however, nevertheless, it is greatly satisfactory than that in the conventional type method.

As embeddability is not required for an insulation film between wiring layers formed after planarization by CMP, a silicon-oxide film can be formed by normal sputtering. In that case, sufficient characteristics are acquired in case the diameter of a via hole is large (1 to 1.4 µm or more), however, as the diameter of the via hole is reduced, failure that a superconducting critical current value decreases occurs. For a chain including a via hole the diameter of which is 0.6 µm and which has been not reviewed, the superconducting critical current value of many samples is $1/100$ or less or is approximately zero. In case a silicon-oxide film is formed by bias sputtering as a layer insulation film, such a problem is not caused. Though the mechanism is not definite, the superconductive characteristic of a niobium layer formed on the layer insulation film is enhanced by forming the layer insulation film by bias sputtering that does not require planarization and a circuit having a minuter pattern can be produced. The result (except the conventional type method) of TEG2 shown in Table 1 is produced as described above and in a chain including a via hole the diameter of which is 0.6 µm, a high yield is achieved.

In the invention, when the insulation film formed on the Josephson junction is etched, the boundary of the Josephson junction is covered with a photoresist mask so as to prevent from being exposed to etching. When the photoresist mask is not formed, Josephson junction characteristics are greatly deteriorated. In samples in which no photoresist mask is formed in this region for comparison, the dispersion of superconducting critical current values increases, reaches a few times of a standard (2%) or more or in the worst one, a junction is short-circuited and characteristics of Josephson junction are not shown. To produce multilevel wiring in which multiple Josephson junctions are integrated, the planar technique of junctions without the deterioration of characteristics and the increase of dispersion and having a high yield is required. As shown by the result of TEG3, it is clear that a yield is enhanced by covering a junction with a photoresist mask.

In the method according to the invention, for wiring patterns the wiring width of which is 0.5, 1, 2, 4, 8, 20, 40, 80, 160 μm and a rectangular pattern the length of one side of which is approximately 1 mm, flatness that initial difference in a level is 10% or less can be acquired.

According to the method disclosed in the patent document 2, a wiring sample is produced as follows. $SiO_2$ is deposited by normal sputtering at a stage shown in FIG. 2A so that it has the thickness of approximately 1.5 times of a step and after the $SiO_2$ is etched using a reversal pattern of wiring as a mask, it is planarized by CMP. It takes approximately 5 minutes for CMP and it is longer by approximately 5 times, compared with that in the method according to the invention. As the polished surface is flat, for the formation of an $SiO_2$ film, no precise control and no uniformity in the substrate are required and even a film the surface of which is rough and which has irregularities is allowed, the method is advantageous at this point. However, dispersion in the final thickness of a pattern is large. $SiO_2$ (therefore, also Nb wiring) is thin in a region in which thin Nb wiring patterns are dense, and the thickness of a pattern in which wiring 0.5 μm thick is arranged at an interval of 0.5 μm is approximately a half of the thickness of a pattern including one wiring 0.5 μm thick. As a circuit parameter, particularly inductance important in a Josephson SFQ circuit also varies substantially in proportion to the thickness when the thickness varies depending upon a pattern as described above, it is difficult to produce an integrated circuit the characteristics of which are uniform in this method.

The wiring manufacturing method and the structure of the niobium Josephson device have been described above, however, the method and the structure equivalent to the first embodiment are not limited to the niobium Josephson device and can be also applied to a device using an oxide high-temperature superconductor or multilevel wiring of a general electronic device. At that time, it need scarcely be said that the silicon substrate may be also a semiconductor substrate made of GaAs or a glass substrate, the silicon-oxide film may be also an insulation film including a general organic substance and niobium wiring may be also a general metallic conductor.

Embodiment II

Figure 6:
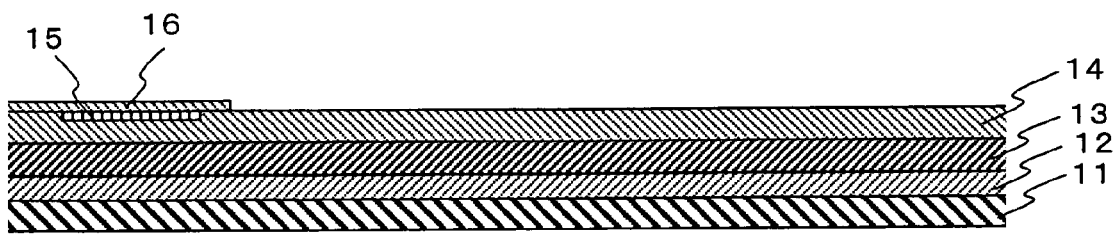
FIGS. 6A, 6B and 6C are sectional views of a device for explaining an example in which a resistor layer and junctions are provided, further, an insulation film having even thickness is formed on a wiring pattern made of niobium and connected to another niobium layer and further, a highest layer made of niobium of a Josephson device including a niobium layer having a resistor layer is formed according to prior art.
Figure 6:
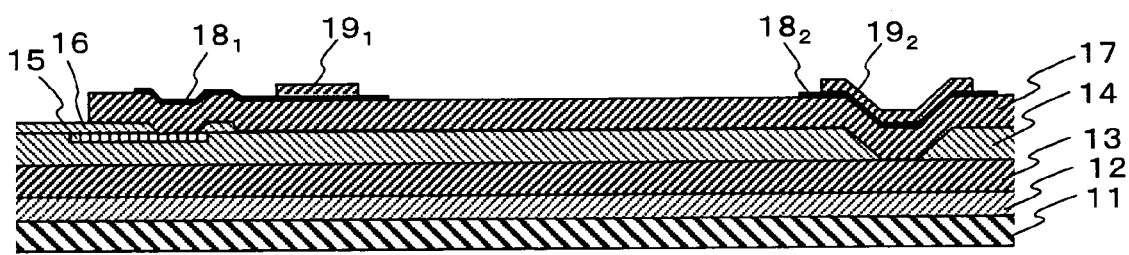
Figure 6:
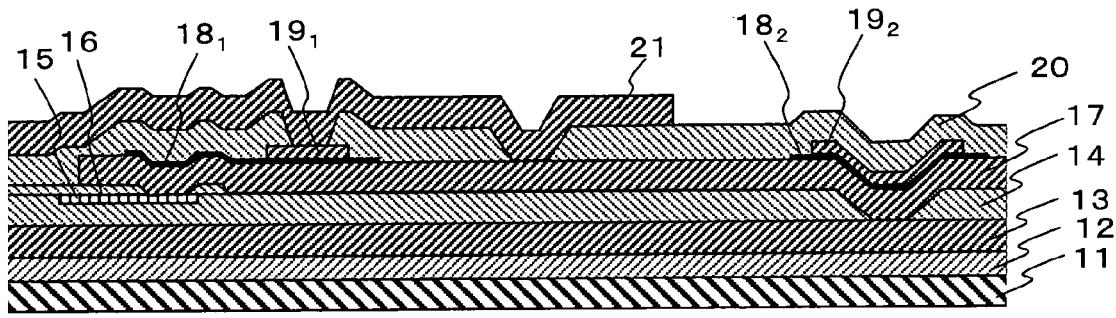
Figure 7:
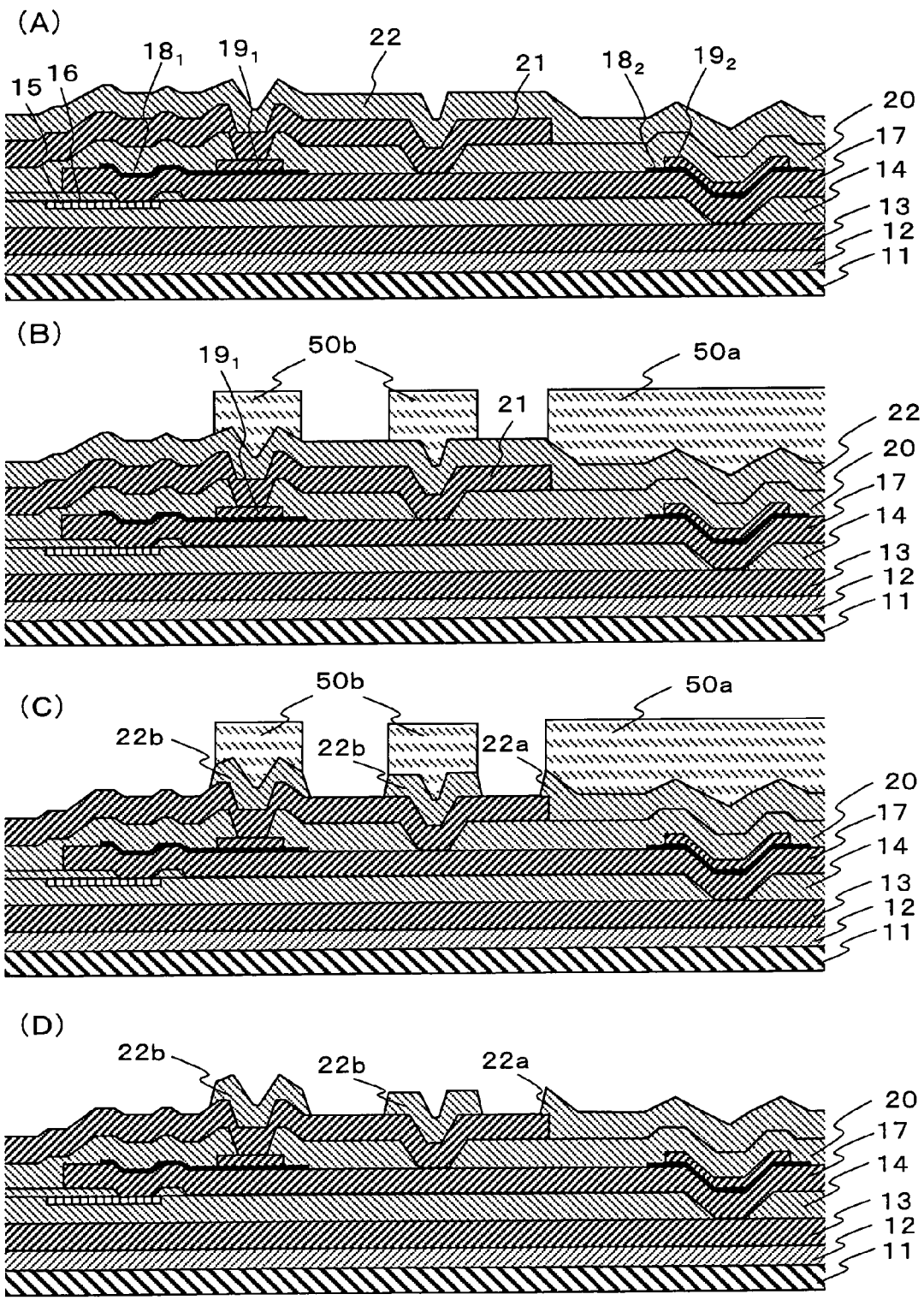
FIGS. 7A, 7B, 7C and 7D show a process succeeding a stage at which the treatment shown in FIG. 6C is finished and are sectional views of the device for explaining a state in which an insulation film having even thickness is formed on a wiring pattern made of niobium and a stage on the way where a wiring pattern made of niobium is formed on the insulation film.
Figure 8:
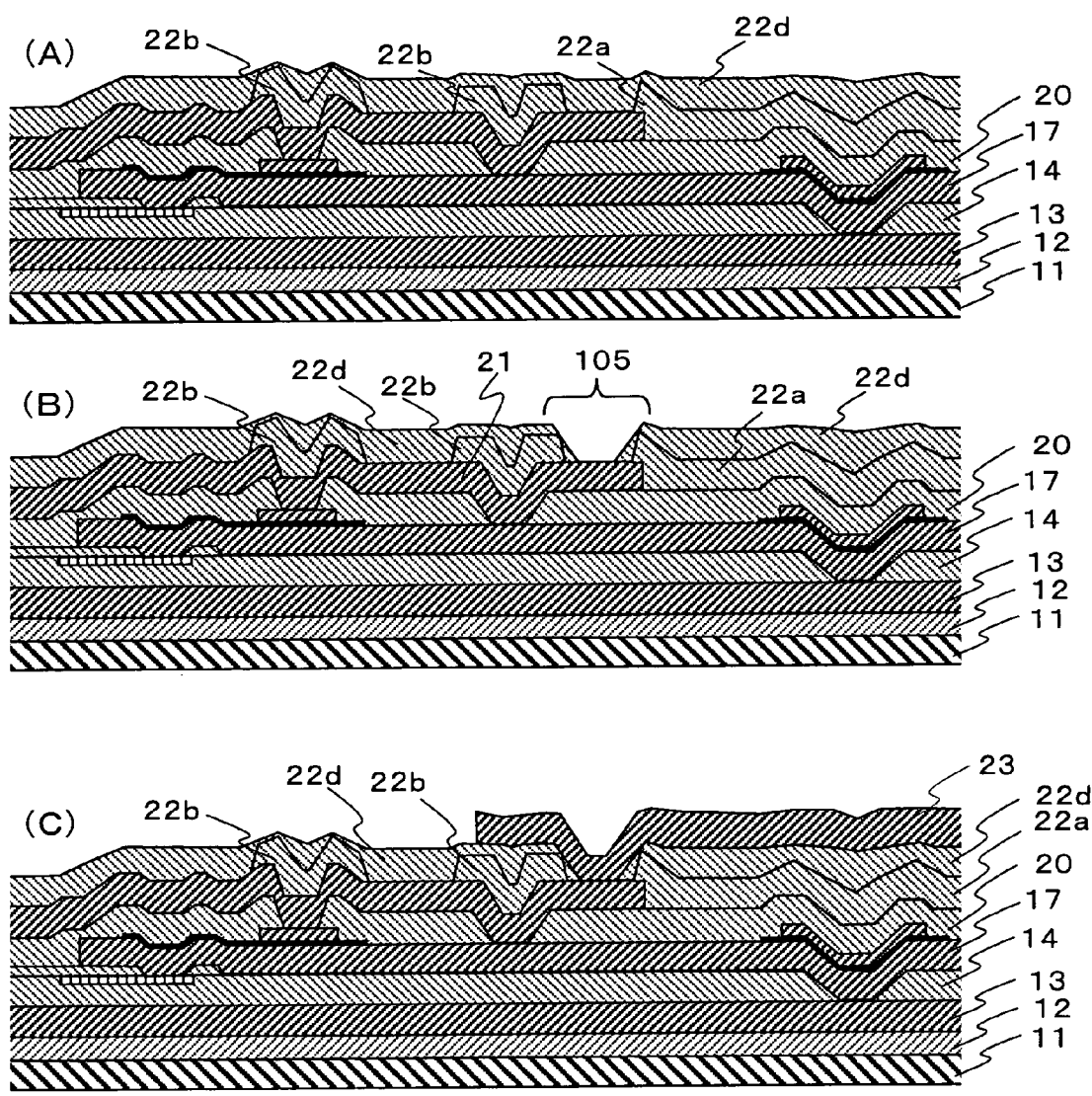
FIGS. 8A, 8B and 8C show a process succeeding a stage at which the treatment shown in FIG. 7D is finished and are sectional views of the device for explaining a state in which an insulation film having even thickness is formed on a wiring pattern made of niobium and a state till a final stage at which a wiring pattern made of niobium is formed on the insulation film.
Figure 9:
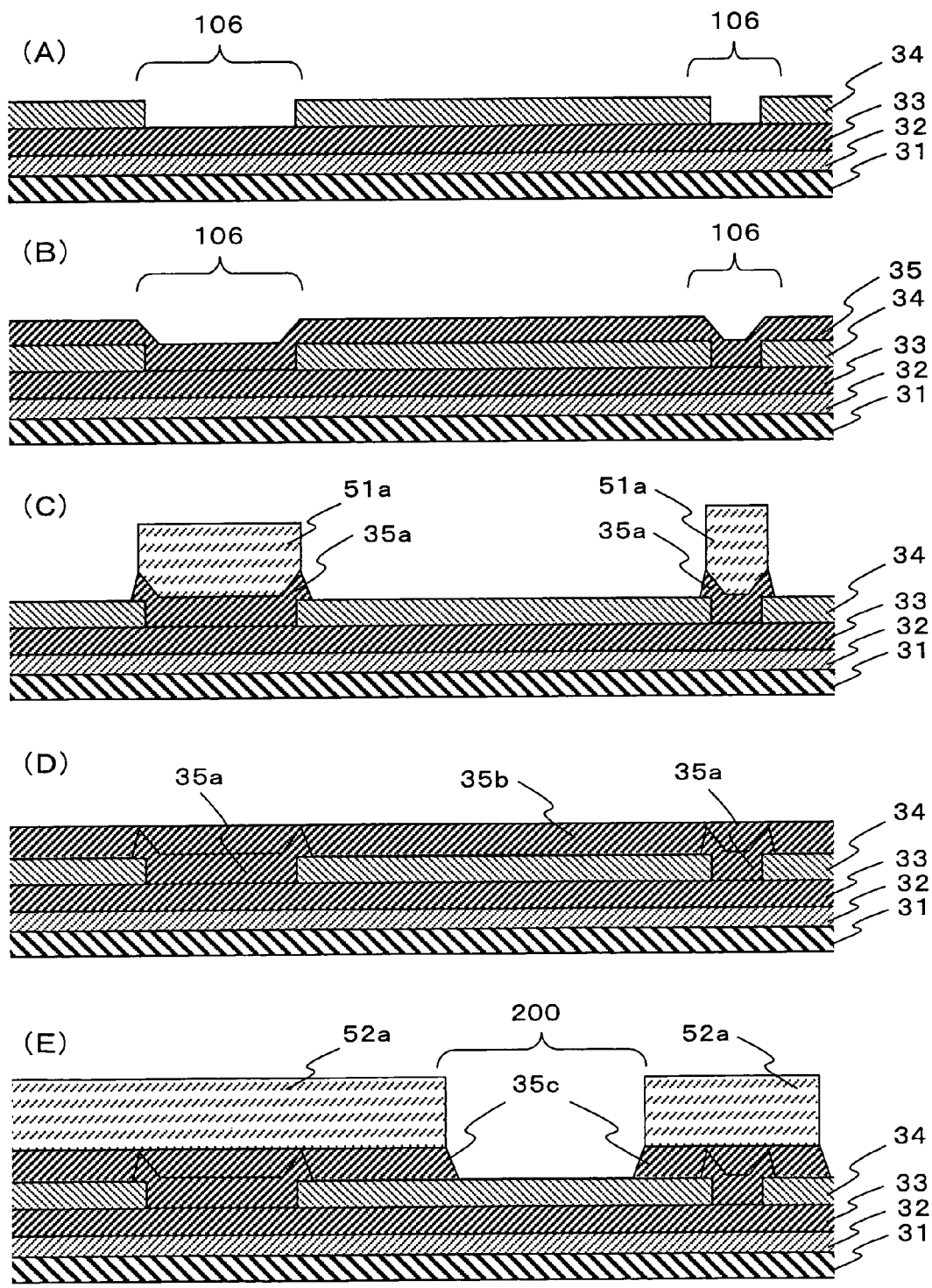
FIGS. 9A to 9E show that a niobium layer is planarized in place of the planarization of the insulation film made of $SiO_2$ as in the first and second embodiments and the invention is applied to planarized multilevel wiring of niobium layers and show a process for forming a layer insulation film and wiring for one layer.

FIGS. 6 to 8 show that the invention is applied to planarized multilevel wiring of a niobium Josephson device having a resistor layer and junctions and shows a process for forming layer insulation films, wiring and a connection between layers. The planarized multilevel wiring will be described in the order of the drawings below.

FIGS. 6A, 6B and 6C are sectional views of a device for explaining an example in which a resistor layer and junctions are provided, further, an insulation film having even thickness is formed on a wiring pattern made of niobium and connected to another niobium layer and further, a highest layer made of niobium of a Josephson device including a niobium layer having the resistor layer is formed according to the prior art.

In FIG. 6A, as in FIG. 2A, a thermal silicon-oxide film 12 as an insulation film is formed on a silicon substrate 11, a niobium layer 13 (300 nm thick) is formed by sputtering as a first metallic layer and is patterned using normal photolithography and dry etching so that it is desired wiring. A silicon-oxide film 14 ($SiO_2$: 300 nm thick) is formed on it by sputtering as an insulation film. A molybdenum (Mo) layer 15 having the thickness of 100 nm is formed as a resistor in a predetermined position of the insulation film 14 made of $SiO_2$, is patterned so that it has a desired shape, and further, an insulation film 16 made of $SiO_2$ and having the thickness of 100 nm is formed on the Mo layer.

Next, in FIG. 6B, photolithography and dry etching are applied to the insulation film 14 made of $SiO_2$, the insulation film 14 made of $SiO_2$ in a desired position is removed, and a via hole is made. Next, an inclusion at the bottom of the via hole is removed by sputter cleaning, a niobium layer 17 having the thickness of 300 nm is formed keeping the niobium layer in a vacuum and is patterned using photolithography and dry etching so that it has a desired shape. Further, aluminum-oxide layers 181, 182 having the thickness of a few nm are formed by holding in a chamber in which oxygen partial pressure is controlled for fixed time after aluminum 10 nm thick is sputtered in a desired position of the niobium layer 17. Niobium layers 191, 192 having the thickness of 150 nm are formed on the aluminum-oxide layers 181, 182 by sputtering. A three-layer structure film composed of the niobium layer 17, each aluminum-oxide layer 181, 182 and each niobium layer 191, 192 is patterned in order from the downside, and the junctions and wiring are formed.

Next, in FIG. 6C, further, an insulation film 20 made of $SiO_2$ and having the thickness of 300 nm is deposited. Next, the insulation film 20 made of $SiO_2$ is removed in a desired position using photolithography and dry etching and via holes are made. An inclusion at the bottom of the via hole is removed by sputter cleaning, a niobium layer 21 having the thickness of 300 nm is formed keeping it in a vacuum and is patterned. The niobium layer 21 is connected to the niobium layer $19_1$ and a part of the niobium layer 17. The niobium layer $19_2$ is connected to nothing in this sectional position.

A device produced according to a procedure shown in FIGS. 6A, 6B and 6C depends upon the prior art. That is, the device is formed without the removal by etching using a reversal pattern of the insulation film made of $SiO_2$ and the process of the step left at the stage of the etching respectively shown in FIGS. 3 and 4.

FIGS. 7A, 7B, 7C and 7D show a process succeeding the stage at which the process shown in FIG. 6D is finished and are sectional views of the device for explaining a state in which an insulation film 22 made of $SiO_2$ and having even thickness is formed on the wiring pattern 21 made of niobium and until a wiring pattern 23 made of niobium is formed.

FIG. 7A shows a state in which the insulation film 22 made of $SiO_2$ and having even thickness is formed on the wiring pattern 21 made of niobium in the device to which the process shown in FIG. 6D is applied. The insulation film made of $SiO_2$ and having the thickness of 350 nm is formed by bias sputtering. The thickness of the insulation film is adjusted so that the surface of the insulation film 22 made of $SiO_2$ formed in a region without the wiring pattern 21 made of niobium on the downside is at the same level as the surface of the niobium layer 21. In this case, the reason why the thickness of the insulation film 22 made of $SiO_2$ is set to 350 nm thicker than 300 nm which is the thickness of the niobium layer 21 by 50 nm is to compensate an etch amount by approximately 50 nm of the insulation film 20 made of $SiO_2$ on the downside of the wiring pattern 21 made of niobium when the wiring pattern 21 made of niobium is patterned.

FIG. 7B shows a state in which a mask for removing each convex portion of the insulation film 22 made of $SiO_2$ formed in FIG. 7A is formed by photoresist 50a, 50b. The mask is based upon a reversal pattern of the highest wiring pattern 21 made of niobium, however, the reversal pattern is different from a simple reversal pattern as described in relation to FIG. 3B. That is, the pattern information of the via holes is synthesized and a mask pattern is produced so that the difference in a level of the via hole with the niobium layer $19_1$ and the difference in a level of the via hole with the niobium layer 13 are masked by 50b in addition to a mask 50a corresponding to the reversal pattern of the wiring pattern 21 made of niobium. Actually, as described in relation to FIG. 3B, a reversal pattern further broadened by 0.3 μm is used.

FIG. 7C shows a state in which the insulation film 22 made of $SiO_2$ is etched using the masks 50a, 50b by photoresist formed in FIG. 7B. The insulation film 22 made of $SiO_2$ is etched except the periphery 22a of the wiring pattern 21 made of niobium and each periphery 22b of the via holes. $CHF_3$ is used for etching gas and as the etching rate of the niobium layer can be reduced up to 1/10 to 1/20 of the etching rate of the $SiO_2$ layer as described in relation to FIG. 3B, sufficient overetching time can be secured. As a result, even if the etched thickness of the $SiO_2$ layer is disperse depending upon a location, etching can be stopped on the surface of the niobium layer.

FIG. 7D shows a state in which the photoresist masks shown in FIG. 7C are removed. The left large steps of the insulation film 22 made of $SiO_2$ are only the periphery 22a of the wiring pattern 21 made of niobium and each periphery 22b of the via holes. The width of these patterns is substantially 0.5 μm or less. Even if the original insulation film 22 made of $SiO_2$ has wide convex portions from the surface, the wide convex portions can be changed to convex portions the width of which is narrowed and therefore, which have lower density in the process shown in FIGS. 7B, 7C and 7D.

FIGS. 8A, 8B and 8C show a process succeeding the stage at which the process shown in FIG. 7D is finished and are sectional views of the device for explaining a state in which the insulation film 22 made of $SiO_2$ and having even thickness is formed on the wiring pattern 21 made of niobium and till a final stage at which a wiring pattern 23 made of niobium is formed on the insulation film.

In FIG. 8A, an insulation film 22d made of $SiO_2$ is formed applying bias to the substrate shown in FIG. 7D. The abrupt convex portions left in FIG. 7D are buried by suitably setting a bias condition, are mostly annihilated and can be planarized. In this case, bias is set to a value at which 70 to 90% of deposited $SiO_2$ is etched and the insulation film 22d made of $SiO_2$ and having the thickness of 300 nm is formed.

That is, in the second embodiment, as in the process from FIG. 3D to FIG. 4A in the first embodiment, abrupt convex portions are buried in the process from FIG. 7D to FIG. 8A, are mostly annihilated, and the planarized insulation film 22d made of $SiO_2$ is also formed. A problem of the separation(peeling off) of the insulation film made of $SiO_2$ caused because adhesive strength between niobium layer and the $SiO_2$ is deteriorated can be prevented by cleaning the surface of the lower niobium layer by argon sputtering cleaning before the deposition of the insulation film 22d made of $SiO_2$.

Next, as shown in FIG. 8B, a via hole 105 is made in the insulation film 22d made of $SiO_2$ in a position to be a connection with upper wiring on the wiring pattern 21 made of niobium using normal photolithography and dry etching.

Next, as shown in FIG. 8C, a niobium layer 23 having the thickness of 300 nm is formed and is patterned in a predetermined wiring shape.

As described referring to FIG. 4B, also in the second embodiment, the flatness of the surface of the insulation film 22d made of $SiO_2$ shown in FIG. 8A can be further enhanced by polishing the surface of the insulation film 22d made of $SiO_2$ by approximately 50 nm by CMP in the state shown in FIG. 8A. If processing by CMP is added, more suitable structure for multilevel wiring is acquired.

In the second embodiment, planarization directly by CMP from a state shown in FIG. 7D without using bias sputtering is also possible. Particularly, in a region without a junction or a via hole, that is, in a region including only the step 22a of the insulation film 22d made of $SiO_2$, the insulation film can be planarized only by CMP for a short time. As the ratio of convex portions is very small as described above, polishing under a simple condition for approximately one minute is possible without depending upon a high-performance CMP machine adopted in a large-scale integrated semiconductor manufacturing system.

Planarization by a method except the above-mentioned method is also possible. When resist is applied and etchback is performed using mixed gas of $CHF_3$ and $O_2$, the similar flatness to that shown in FIG. 8A can be acquired.

In the state shown in FIG. 8A, an abrupt step hardly exists and reliable smoothed multilevel wiring can be formed by repeating these processes. A device is formed by four-layer wiring and characteristics are evaluated. Table 2 shows the ratio of non-defective ones of 60 chips one wafer.

TABLE 2

| Planarization method | TEG1 | TEG2 | TEG3 |
|---|---|---|---|
| Bias sputtering | 60/60 | 60/60 | 59/60 |
| Same, however, simple reversal pattern including only 50a and not including 50b | 60/60 | 17/60 | 55/60 |
| Conventional type method | 18/60 | 7/60 | 59/60 |

Where TEG1: Interlayer leak on steps of lower wiring (a cross meander pattern, L/S=2/2 μm, opposite area: 40000 μm$^2$). Non-defective criterion: 100 MΩ or more when 1 V is applied TEG2: 1000 pieces of via hole chains. Via holes are stacked and the diameter of via holes is 0.5 μm, 1.5 μm and 2.5 μm from the downside. Non-defective criterion: critical current at liquid helium temperature (4.2 k): 10 mA or more TEG3: 1000 pieces of Josephson junction chains. The diameter of a junction is 1.0 μm. Non-defective criterion: critical current dispersion (standard deviation): 2% or less In this case, the conventional type method also means a case that the device is formed without the removal by etching with a reversal pattern of an insulation film made of $SiO_2$ and the treatment of steps left at the stage of the etching respectively described in relation to FIGS. 7C and 7D.

In TEG2 of a test pattern including a via hole, a yield greatly varies depending upon whether the via hole is covered or not. It is known that except the method according to the invention in which etching is performed using a mask covering the via hole, a sufficient yield (reliability) cannot be acquired.

The wiring manufacturing method and the structure of the Nb Josephson device have been described, however, the method and the structure in the second embodiment are not limited to an Nb Josephson device, and the invention can be also applied to a device using an oxide-based high-temperature superconductor and the multilevel wiring of a general electronic device. At that time, it need scarcely be said that the silicon substrate described above may be also a GaAs semiconductor substrate or a glass substrate, the silicon-oxide film may be also an insulation film including a general organic substance and niobium wiring may be also a general metallic conductor.

Embodiment III

Figure 10:
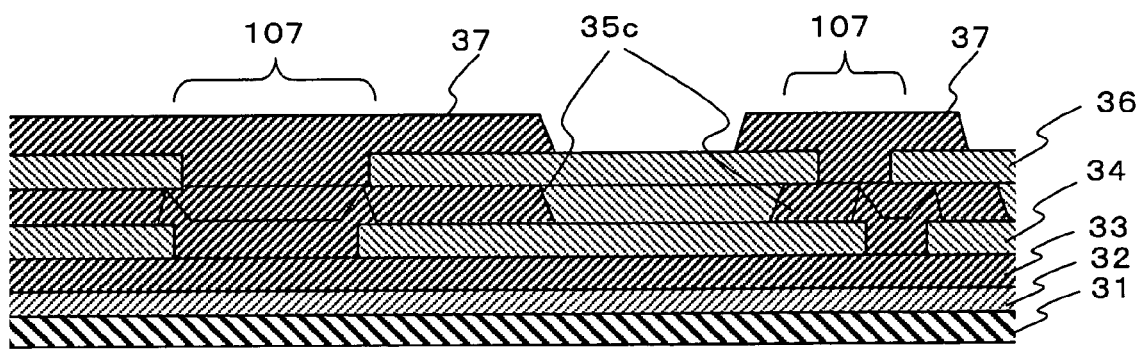
FIG. 10 is a sectional view of the device showing a result of further forming wiring structure for two layers on the structure shown in FIG. 9D by repeating the process shown in FIG. 9.

In a third embodiment, differently from the first and second embodiments, a niobium layer is planarized in place of the planarization of the $SiO_2$ layer and the invention is applied to planarized multilevel wiring of niobium layers. FIGS. 9A to 9E show a process for forming a layer insulation film and wiring for one layer, and FIG. 10 is a sectional view of a device showing a result of further forming wiring structure for two layers on structure shown in FIG. 9D by repeating the process shown in FIG. 9.

As shown in FIG. 9A, after a thermal silicon-oxide film 32 is formed on a silicon substrate 31 as an insulation film, a niobium layer 33 having the thickness of 300 nm is formed by sputtering as a first metallic layer and is patterned in a desired shape using normal photolithography and dry etching. A silicon-oxide ($SiO_2$) film 34 having the thickness of 300 nm is formed on it by sputtering as an insulation film. Similarly, the $SiO_2$ layer in a desired position of the insulation film 34 made of $SiO_2$ is removed using photolithography and dry etching and a via hole 106 is made.

As shown in FIG. 9B, an inclusion at the bottom of the via hole is removed by sputter cleaning and a niobium layer 35 having the thickness of 300 nm is buried in the via hole 106 by bias sputtering, keeping the niobium layer in a vacuum. In this case, when the niobium layer is formed by bias sputtering on a condition that approximately 30% of a flat deposited part of the niobium layer 35 is etched, it can be also buried in a via hole the aspect ratio of which is approximately 1.

In FIG. 9C, first, after photoresist 51 is formed over the substrate shown in FIG. 9B, photoresist 51a in a part covering the via hole 106 is left using photolithography and dry etching. The photoresist can be formed using a reversal pattern broadened by 0.3 μm of a mask used when a via hole layer is formed. Next, the niobium layer 35a is left only in a part corresponding to the via hole 106 using this as a mask by dry etching. That is, only the niobium layer 35a in the part corresponding to the via hole 106 is left and the niobium layer 35 except the via hole is removed.

Next, as shown in FIG. 9D, after the photoresist 51a is removed, a niobium layer 35b having the thickness of 300 nm is formed by bias sputtering to smooth a convex portion of the niobium layer 35a. In this case, when niobium is deposited by bias sputtering on a condition that approximately 60% of the flat deposited film is etched, a final step left in a part of the niobium layer 35a in a part corresponding to the via hole 106 can be reduced up to approximately 1/10 of 300 nm which is deposited thickness.

In FIG. 9E, after photoresist 52 is formed over the substrate shown in FIG. 9D, photoresist 52a except a part where an insulating part 200 is formed is left using photolithography and dry etching. Next, the niobium layer 35b in the part corresponding to the insulating part 200 is removed using this as a mask by photolithography and dry etching and a niobium layer 35c to be wiring is left. That is, the niobium layer 35 is patterned so that only the niobium layer 35b in the part corresponding to the insulating part 200 is removed and the niobium layer 35c is left.

In FIG. 10, the above-mentioned process is repeated, two-layer via holes are stacked, and further, a wiring layer is formed. That is, after the photoresist 52a is removed, an insulation film 36 made of $SiO_2$ is formed on the part corresponding to the insulating part 200 and the niobium layer 35c. Afterward, an opening 107 is made in the insulation film 36 made of $SiO_2$ substantially over the via hole 106 shown in FIG. 9A as shown in FIG. 9A, a niobium layer 37 is formed as shown in FIGS. 9A to 9E and is patterned.

In the first embodiment, the structure in which the via holes are vertically stacked is also shown in FIG. 5B. That is, structure that two niobium layers of the niobium layer 3 and the niobium layer 9b are connected via the niobium layer 5a is shown, however, as known from FIG. 5B, the diameter of the upper via hole 104 is set so that the diameter is larger than that of the lower via hole. In the third embodiment, the upper and lower via holes having the substantially same size can be connected. Needless to say, if there is no other constraint, the diameter of the upper via hole can be also formed by this method so that the diameter is smaller than that of the lower via hole. In the third embodiment, as difference in a level in the via hole is not increased, further multiple via holes can be vertically stacked, a degree of freedom is increased when the wiring of the device is arranged, and integration is enhanced.

The wiring manufacturing method and the structure of the Nb Josephson device have been described, however, the method and the structure described in the third embodiment are not limited to only the Nb Josephson device, and the invention can be also applied to a device using an oxide-based high-temperature superconductor and the multilevel wiring of a general electronic device. At that time, it need scarcely be said that the above-mentioned silicon substrate may be also a GaAs semiconductor substrate or a glass substrate, the silicon-oxide film may be also an insulation film including a general organic substance and niobium wiring may be also a general metallic conductor.

Embodiment IV

Figure 11:
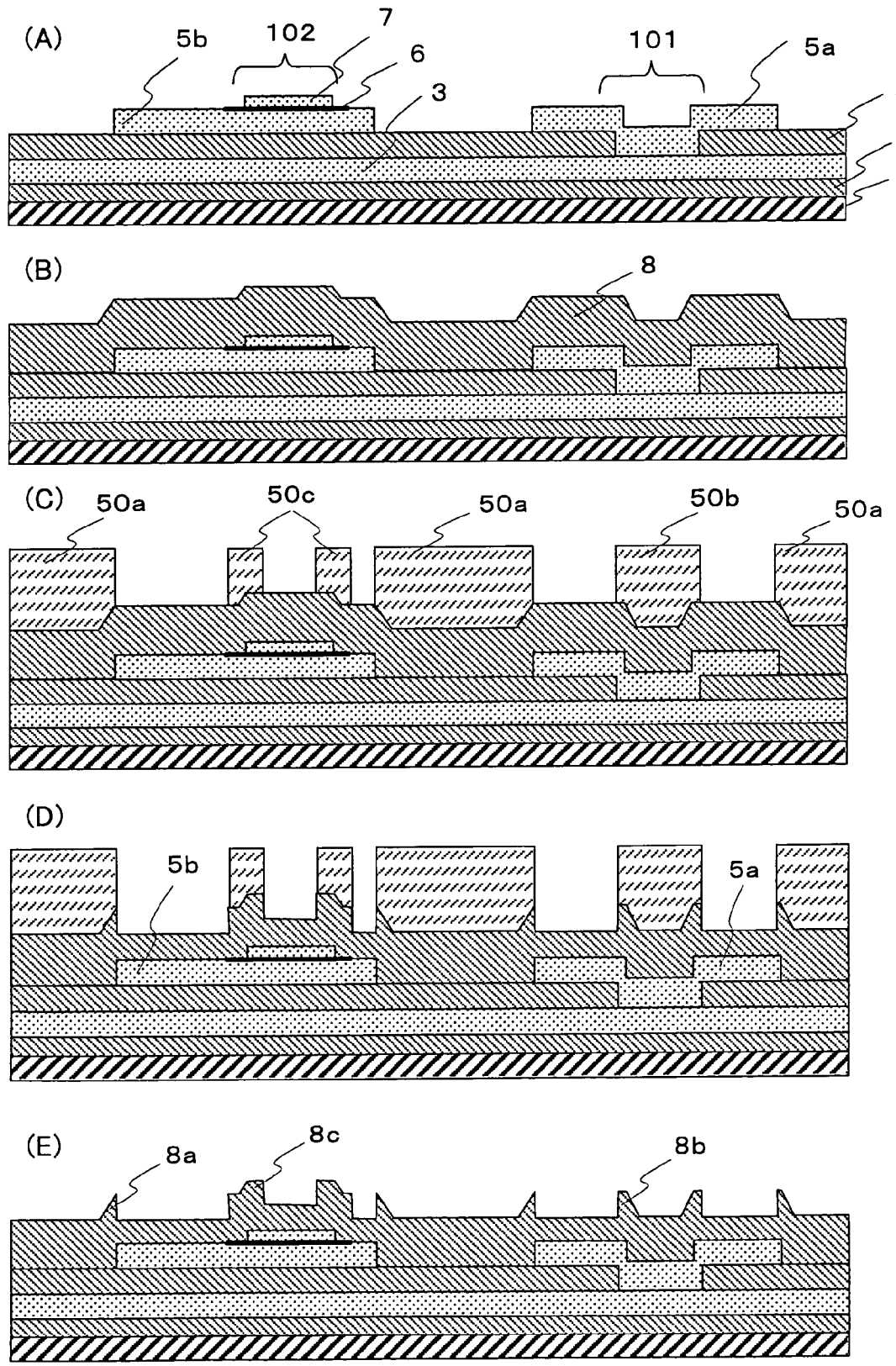
FIGS. 11A, 11B, 11C, 11D and 11E are sectional views of a device for explaining a prestep of a process for forming an insulation film having even thickness on a wiring pattern made of niobium provided with a junction and a wiring pattern made of niobium and connected to a lower niobium layer.

FIG. 11 show that the invention is applied to the planarized multilevel wiring of a niobium Josephson device and shows a process for forming a layer insulation film, wiring and a connection between layers. The process will be described in the order of the drawings.

FIGS. 11A to 11E are sectional views of the device for explaining a prestep of a process for forming an insulation film 8 made of $SiO_2$ having even thickness on a wiring pattern 5b made of niobium and provided with a junction 102 and on a wiring pattern 5a made of niobium and connected to a lower niobium layer 3.

FIG. 11A is a sectional view of the device showing a state at which the junction is formed. FIG. 11B shows a state in which the insulation film 8 made of $SiO_2$ having the thickness of 650 nm is formed by bias sputtering. The thickness of the insulation film is adjusted so that the surface of the insulation film 8 made of $SiO_2$ formed in a region without the niobium layers 5a, 5b and 7 on the downside is at the same level as the position of a final interlayer film. In this case, it is desirable that the insulation film 8 made of $SiO_2$ having the thickness of 650 nm thicker than the sum of 300 nm which is the thickness of each niobium layer 5a, 5b and 300 nm which is the thickness of the final interlayer film by 50 nm is formed. This is to compensate an etched amount by approximately 50 nm of an insulation film 4 made of $SiO_2$ under Nb when the niobium layer 5 is patterned.

In case a step formed by the niobium layers 5a and 5b is small, normal sputtering can be also used, however, to bury between wiring made of the niobium layers 5a and 5b without voids and produce a wiring system the insulation performance of which is reliable, bias sputtering excellent in step coverage is suitable. In this case, as the heat resistance of the junction 102 is 150 to 200° C. and is low, another suitable method cannot be found as a method of forming the insulation film 8 made of $SiO_2$.

FIG. 11C shows a result of forming a mask for removing a convex portion of the insulation film 8 made of $SiO_2$ formed in FIG. 11B by a resist film. This is a result of providing a resist film 50 overall in a state shown in FIG. 11B and forming by photolithography by a photomask based upon a reversal pattern of each wiring pattern 5a, 5b made of niobium. The reversal pattern of the wiring pattern 5a, 5b made of niobium does not means a simple reversal pattern. That is, a resist film 50a corresponds to the reversal pattern of the wiring pattern 5a, 5b made of niobium. A resist film 50b corresponds to difference in a level made in a connection of the lower niobium layer 3 and the niobium layer 5a via a via hole 101 and a resist film 50c corresponds to difference in a level made in the junction 102. The pattern information of the junction 102 and the via hole 101 is synthesized with the pattern information of the wiring patterns 5a, 5b made of niobium so that the resist film 50 is left using these parts as a mask and a mask pattern is produced.

Actually, the reversal pattern further broadened by 0.5 µm is used. Operation for broadening means applying the etching of the insulation film 8 made of $SiO_2$ to only a flat convex portion in a step (an etching process) explained in FIG. 11D and avoiding applying the etching of the insulation film to a tilted part. When the tilted part is exposed to etching, a region where the finally left thickness is short is made.

FIG. 11D shows a state in which the insulation film 8 made of $SiO_2$ is etched by the photoresist masks 50a, 50b and 50c. $CHF_3$ is used for etching gas. Differently from the first, second and third embodiments, etching is required to be stopped on the way of the insulation film 8 made of $SiO_2$. Therefore, this etching process is required to be excellent in repeatability and uniformity. The lower limit of the uniformity of etching thickness in the substrate is approximately ±20% and in case more excellent uniformity is required, it is desirable that desired thickness is made after etching up to the niobium layer as in the first, second and third embodiments. In the case of a device in which the dispersion of approximately ±20% is allowable, a process for forming a film can be omitted by stopping etching halfway as described above.

FIG. 11E shows a state in which the photoresist masks 50a, 50b and 50c are removed after the treatment shown in FIG. 11D. Steps left at this stage of the insulation film 8 made of $SiO_2$ are only the periphery 8a of the wiring patterns 5a, 5b made of niobium, the periphery 8b of the via hole and a junction 8c. The width of these patterns is substantially 0.5 µm or less.

Figure 12:
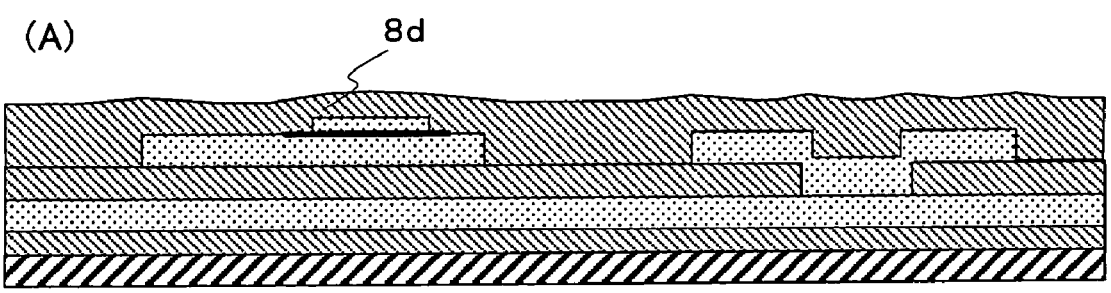
FIGS. 12A and 12B show subsequent treatment succeeding a stage at which the treatment shown in FIG. 11E is finished and are sectional views of the device for explaining a state in which an insulation film having even thickness is formed on a wiring pattern made of niobium and a wiring pattern made of niobium and connected to a lower niobium layer.
Figure 12:
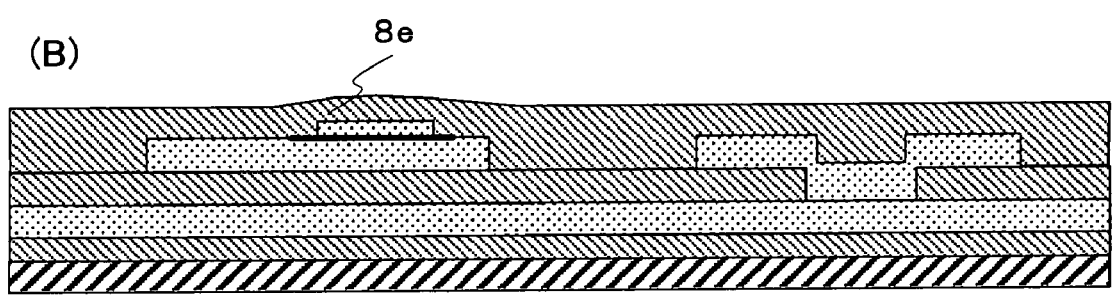

FIG. 12 show subsequent treatment succeeding a stage at which treatment shown in FIG. 11E is finished.

In FIG. 12A, the insulation film 8 made of $SiO_2$ is formed on the wiring pattern 5b made of niobium and the wiring pattern 5a made of niobium and connected to the lower niobium layer 3, applying bias to the silicon substrate 1 in addition to the structure shown in FIG. 11E. The convex portions left in a state shown in FIG. 11E are mostly annihilated by setting a bias condition to a higher value and the insulation film made of $SiO_2$ can be planarized with the substantially increased thickness of the insulation film made of $SiO_2$ zero. That is, bias is set to a value for setting a deposited amount of $SiO_2$ in a flat part to 0% and $SiO_2$ is sputtered for thirty minutes. In case no bias is applied to a target, power for depositing $SiO_2$ by 300 nm is turned on.

In this state, difference in a level left on the surface of the insulation film 8 made of $SiO_2$ is at most 100 nm and an amount of difference in a level can be reduced up to approximately ⅕ of the difference in a level in the state shown in FIG. 11E. Therefore, a wiring pattern is formed on the insulation film 8 made of $SiO_2$ or an opening is made in the insulation film 8 made of $SiO_2$ and connection with the wiring pattern formed on the insulation film 8 made of $SiO_2$ can be formed. Reliable and planarized multilevel wiring can be formed by repeating this process.

FIG. 12B shows a result of polishing the insulation film 8 made of $SiO_2$ on the surface of the structure shown in FIG. 11E by CMP. The convex portions left on the insulation film 8 made of $SiO_2$ on the surface shown in FIG. 11E are mostly removed and the flatness of the surface is enhanced.

Afterward, upper wiring can be formed by executing the processes shown in FIG. 5 and the succeeding drawings related to the first embodiment.

The wiring manufacturing method and the structure of the niobium Josephson device have been described, however, the method and the structure in the fourth embodiment are not limited to only the niobium Josephson device and can be also applied to a device using an oxide-based high-temperature superconductor and the multilevel wiring of a general electronic device. At that time, it need scarcely be said that the silicon substrate may be also a GaAs semiconductor substrate or a glass substrate, the silicon-oxide film may be also an insulation film including a general organic substance and niobium wiring may be also a general metallic conductor.

The yield and the reliability of the multilevel wiring of the Josephson device can be enhanced and large-scale and high-performance LSI can be realized.

What is claimed is:

1. A method of manufacturing multilevel wiring for an electronic device provided with wiring layer patterns which hold an insulation layer between them and are partially connected, comprising in the following order:
   (a) a process for producing a substrate where a patterned wiring layer is formed on a flat insulation layer or an insulation layer provided with a via hole for partially connecting upper and lower wiring layer patterns;
   (b) a process for forming an insulation layer overall on the substrate so that the height of the top face of the insulation layer for burying a region without a wiring layer pattern is equal to the height of the top face of the wiring layer pattern;
   (c) (c-1) a process for forming a photoresist pattern provided with an opening on the wiring layer pattern on the insulation layer formed overall on the substrate;
   (d) a process for etching the insulation layer exposed from the photoresist pattern until the surface of the wiring layer is exposed;
   (e) a process for removing the convex insulation layer left in the vicinity of a boundary of the wiring layer pattern, and/or the convex insulation layer left on the wiring layer buried in the via hole and/or the convex insulation layer left in the vicinity of the boundary of a Josephson junction using bias sputtering or CMP or using both; and (f) a process for forming a second insulation layer provided with a via hole for partially connecting upper and lower wiring layer patterns on the wiring layer formed in the process or on the wiring layer partially including the insulation layer, wherein: further, the processes (a) to (f) are repeated.

2. A method of manufacturing multilevel wiring for an electronic device according to claim 1, wherein:

the process described in (c) is (c-2)a process forming a photoresist pattern provided with an opening on the wiring layer pattern and covering an insulation layer on the wiring layer burying the via hole on the insulation layer formed overall on the substrate.

3. A method of manufacturing multilevel wiring for an electronic device according to claim 1, wherein:

the process described in (c) is (c-3)a process for forming a photoresist pattern provided with an opening on the wiring layer pattern and covering an insulation layer on the wiring layer buried in the via hole and an insulation layer on the end of a Josephson junction on the insulation layer formed overall on the substrate.

4. A method of manufacturing multilevel wiring for a Josephson device provided with wiring layer patterns which hold an insulation layer between them and are partially connected, comprising in the following order:

(a) a process for producing a substrate where a patterned niobium wiring layer is formed on a flat silicon-oxide layer or a silicon-oxide layer provided with a via hole for partially connecting upper and lower wiring layer patterns;

(b) a process for forming a silicon-oxide layer overall on the substrate so that the height of the top face of the silicon-oxide layer for burying a region without a wiring layer pattern is equal to the height of the top face of the wiring layer pattern;

(c) (c-1)a process for forming a photoresist pattern provided with an opening on the wiring layer pattern or (c-2) a process for forming a photoresist pattern provided with the opening and covering a silicon-oxide layer on the wiring layer buried in the via hole on the silicon-oxide layer formed overall on the substrate or (c-3)a process for forming a photoresist pattern provided with the opening and covering a silicon-oxide layer on the wiring layer buried in the via hole and a silicon-oxide layer on the end of a Josephson junction;

(d) a process for etching the silicon-oxide layer exposed from the photoresist pattern until the surface of the wiring layer is exposed;

(e) a process for removing the convex silicon-oxide layer left in the vicinity of a boundary of the wiring layer pattern, and/or the convex silicon-oxide layer left on the wiring layer buried in the via hole and/or the convex silicon-oxide layer left in the vicinity of the boundary of the Josephson junction using bias sputtering or CMP or using both; and (f) a process for forming a second silicon-oxide layer provided with a via hole for partially connecting upper and lower wiring layer patterns on the wiring layer formed in the process or on the wiring layer partially including the insulation layer, wherein: further, the processes (a) to (f) are repeated.

5. A method of manufacturing multilevel wiring for a Josephson device according to claim 4, wherein:

the process described in (c) is (c-3) a process for forming a photoresist pattern provided with an opening on the wiring layer pattern and covering an insulation layer on the wiring layer buried in the via hole and an insulation layer on the end of the Josephson junction on the insulation layer formed overall on the substrate.

6. A method of manufacturing multilevel wiring for a Josephson device provided with wiring layer patterns which hold an insulation layer between them and are partially connected, comprising in the following order:

(a) a process for producing a substrate where a patterned niobium wiring layer is formed on a flat silicon-oxide layer or a silicon-oxide layer provided with a via hole for partially connecting upper and lower wiring layer patterns;

(b) a process for forming a silicon-oxide layer overall on the substrate so that the height of the top face of the silicon-oxide layer for burying a region without a wiring layer pattern is equal to the height of the top face of the wiring layer pattern;

(c) (c-1)a process for forming a photoresist pattern provided with an opening on the wiring layer pattern on the silicon-oxide layer formed overall on the substrate or (c-2) a process for forming a photoresist pattern provided with the opening and covering a silicon-oxide layer on the wiring layer buried in the via hole on the silicon-oxide layer formed overall on the substrate or (c-3) a process for forming a photoresist pattern provided with the opening and covering a silicon-oxide layer on the wiring layer buried in the via hole and a silicon-oxide layer on the end of a Josephson junction;

(d) a process for etching the silicon-oxide layer exposed from the photoresist pattern up to desired depth; and (e) a process for removing the convex silicon-oxide layer left in the vicinity of a boundary of the wiring layer, and/or the convex silicon-oxide layer left on the wiring layer buried in the via hole and/or the convex silicon-oxide layer left in the vicinity of the boundary of the Josephson junction using bias sputtering or CMP or using both, wherein: further, the processes (a) to (e) are repeated.

7. A method of manufacturing multilevel wiring for a Josephson device according to claim 1, wherein:

the process described in (f) is a process for forming a second silicon-oxide layer by bias sputtering.

8. A method of manufacturing multilevel wiring for a Josephson device according to claim 4, wherein:

the process described in (f) is a process for forming a second silicon-oxide layer by bias sputtering.

9. A method of manufacturing multilevel wiring for a Josephson device according to claim 1, wherein:

the process described in (a) is a process for producing a substrate where a wiring layer made of niobium or mainly including niobium is formed and patterned on a flat silicon-oxide layer or on a silicon-oxide layer provided with a via hole for partially connecting upper and lower wiring layer patterns formed by bias sputtering.

10. A method of manufacturing multilevel wiring for a Josephson device according to claim 4, wherein:

the process described in (a) is a process for producing a substrate where a wiring layer made of niobium or mainly including niobium is formed and patterned on a flat silicon-oxide layer or on a silicon-oxide layer provided with a via hole for partially connecting upper and lower wiring layer patterns formed by bias sputtering.

11. A method of manufacturing multilevel wiring for a Josephson device according to claim 6, wherein:
the process described in (a) is a process for producing a substrate where a wiring layer made of niobium or mainly including niobium is formed and patterned on a flat silicon-oxide layer or on a silicon-oxide layer provided with a via hole for partially connecting upper and lower wiring layer patterns formed by bias sputtering.

* * * * *